United States Patent
Osame et al.

(10) Patent No.: US 7,928,950 B2
(45) Date of Patent: Apr. 19, 2011

(54) DATA LATCH CIRCUIT, DRIVING METHOD OF THE DATA LATCH CIRCUIT, AND DISPLAY DEVICE

(75) Inventors: Mitsuaki Osame, Kanagawa (JP); Tatsuro Ueno, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1303 days.

(21) Appl. No.: 11/279,630

(22) Filed: Apr. 13, 2006

(65) Prior Publication Data
US 2006/0244690 A1  Nov. 2, 2006

(30) Foreign Application Priority Data
Apr. 28, 2005 (JP) ................................. 2005-133654

(51) Int. Cl.
G09G 3/36 (2006.01)
G09G 5/00 (2006.01)
G06F 3/038 (2006.01)
H03L 5/00 (2006.01)

(52) U.S. Cl. ........................... 345/98; 345/204; 327/333
(58) Field of Classification Search .......... 345/204–206, 345/98–100; 327/333
See application file for complete search history.

(56) References Cited

U.S. PATENT DOCUMENTS

| 6,774,419 B2 | 8/2004 | Kimura | |
| 7,006,068 B2 | 2/2006 | Haga | |
| 7,042,447 B2 * | 5/2006 | Numao | 345/205 |
| 7,268,756 B2 * | 9/2007 | Koyama et al. | 345/87 |
| 7,327,169 B2 * | 2/2008 | Osame et al. | 345/104 |
| 7,352,604 B2 * | 4/2008 | Shionoiri et al. | 365/94 |
| 7,528,816 B2 * | 5/2009 | Tanaka et al. | 345/98 |
| 2002/0015032 A1 | 2/2002 | Koyama et al. | |
| 2002/0140663 A1 * | 10/2002 | Matsumoto | 345/99 |
| 2003/0063079 A1 * | 4/2003 | Abe et al. | 345/204 |
| 2003/0076149 A1 * | 4/2003 | Haga | 327/333 |

(Continued)

FOREIGN PATENT DOCUMENTS

CN  1411150  4/2003

(Continued)

OTHER PUBLICATIONS

Chinese Office Action received Mar. 20, 2009 in Chinese Application No. 200610077259.1 with Full Translation (19 pages).

(Continued)

Primary Examiner — Bipin Shalwala
Assistant Examiner — Matthew A Fry
(74) Attorney, Agent, or Firm — Fish & Richardson P.C.

(57) ABSTRACT

The present invention provides a data latch circuit which can operate stably with a low-amplitude signal, which consumes less electric power, and which is resistant against the variation in TFTs.
When an analog switch is turned on, a data signal is inputted to a gate electrode of an n-channel TFT and, at this time, VDD is supplied to an input terminal of an inverter. When the analog switch in turned off, the n-channel TFT is turned on or off depending on a level of the data signal. When the data signal is at an H level, the n-channel TFT is turned on and VSS is supplied to the input terminal of the inverter. When the data signal is at an L level, VDD is supplied to an input terminal of the inverter. Therefore, only VDD and VSS levels are applied to the input terminal of the inverter.

8 Claims, 15 Drawing Sheets

U.S. PATENT DOCUMENTS

| | | | |
|---|---|---|---|
| 2003/0210219 A1* | 11/2003 | Osame | 345/92 |
| 2004/0041764 A1* | 3/2004 | Koyama et al. | 345/87 |
| 2004/0095159 A1 | 5/2004 | Kimura | |
| 2004/0100318 A1* | 5/2004 | Lim | 327/333 |
| 2004/0155698 A1 | 8/2004 | Kimura | |
| 2004/0257117 A1 | 12/2004 | Kimura | |
| 2004/0257136 A1 | 12/2004 | Osame et al. | |
| 2005/0012731 A1* | 1/2005 | Yamazaki et al. | 345/204 |
| 2005/0099068 A1 | 5/2005 | Kimura | |
| 2006/0238399 A1* | 10/2006 | Mizukami et al. | 341/155 |
| 2007/0109282 A1 | 5/2007 | Kida et al. | |
| 2008/0150587 A1* | 6/2008 | Osame et al. | 326/95 |

FOREIGN PATENT DOCUMENTS

| | | |
|---|---|---|
| EP | 1 643 482 | 4/2006 |
| JP | 2000-352957 | 12/2000 |
| WO | 2005/004102 | 1/2005 |

OTHER PUBLICATIONS

European Patent Office Search Report (European Patent Application No. 06007517.3), 9 pages, mailed Jun. 12, 2009.

* cited by examiner

PRIOR ART

DATA LATCH CIRCUIT, DRIVING METHOD OF THE DATA LATCH CIRCUIT, AND DISPLAY DEVICE

BACKGROUND OF THE INVENTION

1. Field of Invention

The present invention relates to a data latch circuit for sampling and holding a signal at a desired timing. In particular, the present invention relates to, in an active matrix display device for displaying an image with the use of a digital image signal, a data latch circuit for sampling and holding the digital image signal. Moreover, the present invention relates to an electronic appliance using an active matrix display device having a driver circuit including the data latch circuit.

2. Description of the Related Art

In recent years, techniques for forming a thin film transistor (TFT) over an insulating substrate have drastically progressed, and development of a flat panel display typified by a liquid crystal display device or the like has been promoted in view of the increase in demand of flat panel displays for mobile appliances. In particular, development of techniques for integrally forming a pixel portion for displaying an image and a driver circuit for controlling the pixel portion (hereinafter the pixel portion and the driver circuit are collectively referred to as an internal circuit) over one substrate has been actively promoted.

The internal circuit is connected to a controller IC or the like provided externally (hereinafter referred to as an external circuit) through a flexible printed circuit (FPC) or the like, and the internal circuit is controlled by the external circuit. In recent years, with size reduction of a semiconductor device, the size of an integrated circuit is getting smaller, which results in the advance in application thereof to mobile terminals and the like. Accordingly, further reduction in power consumption is required. Currently, drive voltage of an IC used in the external circuit generally is lower than drive voltage of the internal circuit.

In general, the external circuit outputs a signal with an amplitude of about 3.3 V while the internal circuit needs a drive voltage of about 5 to 10 V, which is higher than the amplitude of the signal outputted from the external circuit. Moreover, the internal circuit needs a data latch circuit for sampling a data signal in a low-amplitude digital form at a desired timing and holding the data signal for a certain period.

Some of data latch circuits are made in consideration of low amplitude signal input (see, for example, Patent Document 1: Japanese Patent Application Laid-Open No. 2000-352957).

However, a data latch circuit corresponding to low signal voltage input causes an error by variation in TFT characteristics, particularly variation in the threshold. Moreover, although the data latch circuit responds to such an error by increasing the amplitude of a signal with the use of a level conversion circuit or the like in accordance with drive voltage of an internal circuit, additional use of such a level conversion circuit or the like increases the expansion of a circuit scale and the increase in power consumption. Therefore, it is desirable to perform normal operation by inputting a low-amplitude signal from an external circuit to an internal circuit without any change.

Here, a conventional general data latch circuit is shown in FIGS. 2A and 2B. An equivalent circuit of a circuit symbol used in FIG. 2A is shown in FIGS. 15A, 15B, and 15C. In FIGS. 15A, 15B, and 15C, as drive power source, a positive power source is denoted by VDD while a negative power source is denoted by VSS.

Operation of the data latch circuit shown in FIG. 2A is briefly described using a timing chart shown in FIG. 2B. In a T1 period shown in FIG. 2B, a sampling (SAMP) signal is set at a high (H) level and an inverted sampling (SAMPB) signal is set at a low (L) level. A clocked inverter 200 operates as an inverter and inverts a data (DATA) signal and outputs the inverted data signal. In the case of using an analog switch 200a, the data (DATA) signal is outputted without any change. At this time, an output waveform in the case of using the clocked inverter 200 is shown by "a" in FIG. 2B as a state of a "node a" in FIG. 2A. Subsequently, an inverter 201 further inverts a state of the "node a" and outputs it to an output terminal (OUT). At this time, an output waveform in the case of using the clocked inverter 200 is denoted by OUT of FIG. 2B as a state of the OUT of FIG. 2A. Output waveforms of the "node a" and the OUT in the case of using the analog switch 200a are omitted because the waveforms are the inversion of the waveforms of the "node a" and the OUT shown in FIG. 2B. At this time, since the output of the clocked inverter 202 has high impedance, the output of the clocked inverter 200 or the analog switch 200a is not interrupted.

Subsequently, a T2 period starts, and when the sampling (SAMP) signal is at the low (L) level and the inverted sampling (SAMPB) signal is at a high (H) level, the output of the clocked inverter 200 or the analog switch 200a has high impedance; therefore, sampling the data (DATA) signal stops. At this time, an output in which the data (DATA) signal just before the termination of the T1 period has been inverted by the clocked inverter 200 appears, and the signal is further inverted by the inverter 201 and then outputted. On the other hand, the clocked inverter 202 operates as an inverter to form a loop with the inverter 201. An input of the inverter 201, i.e., a state of the "node a" is determined by the clocked inverter 202 while an input of the clocked inverter 202, i.e., a state of an output terminal (OUT) is determined by the inverter 201. This state continues during the T2 period and the DATA signal just before the termination of the T1 period is held.

After that, when the sampling (SAMP) signal is set at the high (H) level and the inverted sampling (SAMPB) signal is set at the low (L) level again in a T3 period, the clocked inverter 200 or the analog switch 200a operates similarly to the T1 period to sample the data (DATA) signal at that time and output the sampled data signal to the "node a" in an inverted state or not. When a T4 period starts, a DATA signal just before the termination of the T3 period is held by similar operation.

The above operation is repeated depending on the states of the sampling (SAMP) signal and the inverted sampling (SAMPB) signal, whereby sampling and holding the data (DATA) signal are repeated.

However, the amplitude of a video signal or the like is lower than the power source voltage of a logic element. If a video signal with small amplitude is held in a data latch circuit without any change, through current flows to a logic element in a data holding portion, thereby increasing the power consumption.

SUMMARY OF THE INVENTION

In view of the above problem, it is an object of the present invention to provide a data latch circuit which operates certainly without generating incorrect through current and the like when sampling from outside a signal with smaller amplitude than the amplitude of a drive power source of a circuit.

According to the present invention, the voltage of an input of an inverter is determined by combining a high (H) level and a low (L) level of a data signal of image data or the like, the high (H) level and the low (L) level of the sampling signal (SAMP), and the high (H) level and the low (L) level of the inverted sampling signal (SAMPB). Moreover, in a circuit structure of invention, a first power source potential (positive power source potential: VDD) or a second power source potential (negative power source potential: VSS) is applied to the input of the inverter.

By having such a circuit structure, it is possible to operate the inverter with power source voltage. Therefore, in this circuit structure, through current which has flowed to a conventional inverter can be reduced and the dependency on threshold voltage is less than before. Thus, a circuit hardly affected by a variation in TFT characteristics, with lower power consumption, and being able to operate stably can be provided.

A data latch circuit of the present invention has a circuit structure in which only two potentials of VDD and VSS are applied in a holding portion even though the amplitude of an input signal is smaller than the amplitude of a drive power source. By having such a circuit structure, it is possible to reduce power consumption because through current can be reduced, and to carry out operation certainly without being affected by the variation in the TFT characteristics. Moreover, since boosting with an external circuit is not necessary, it is possible to decrease the power consumption, the layout area, and the cost.

DETAILED DESCRIPTION OF THE INVENTION

Embodiment Modes

Embodiment Mode 1

An embodiment mode of the present invention is hereinafter described with reference to the drawings. In the description of this embodiment mode, the following parameters are used for convenience. It is to be noted that the parameters shown here are one drive condition for a circuit of the present invention, and another combination of different parameters is also allowed as long as a similar operational effect to that in this embodiment mode can be obtained. As a drive power source of the circuit, VSS=0 V and VDD=5 V (5 Vpp) are used. The amplitudes of a sampling (SAMP) signal and an inverted sampling (SAMPB) signal are set at a high (H) level of 5 V and a low (L) level of 0 V (5 Vpp). The amplitudes of a sampling 1 (SAMP1) signal and an inverted sampling 1 (SAMP1B) signal are set at a high (H) level of 5 V and a low (L) level of 0 V (5 Vpp). The amplitude of a data (DATA) signal is set at a high (H) level of 3.3 V and a low (L) level of 0 V (3.3 Vpp). As for TFTs that form the circuit, the threshold voltage of a p-channel TFT is set at −1.5 V and that of an n-channel TFT is set at 1.5 V.

In a thin film transistor formed by forming a silicon thin film as an active layer over an insulating substrate or the like, it is difficult to define a source electrode and a drain electrode because of its structure. Therefore, here, one of electrodes is referred to as a first electrode while the other is referred to as a second electrode, if it is not particularly necessary to define which one is a source electrode or a drain electrode. In general, an electrode having a lower potential serves as a source electrode and an electrode having a higher potential serves as a drain electrode in an n-channel transistor. Meanwhile, in a p-channel transistor, an electrode having a higher potential serves as a source electrode while an electrode having a lower potential serves as a drain electrode. Therefore, the explanation of circuit operation follows the above in the case of describing gate-source voltage and the like.

Figure 1A:
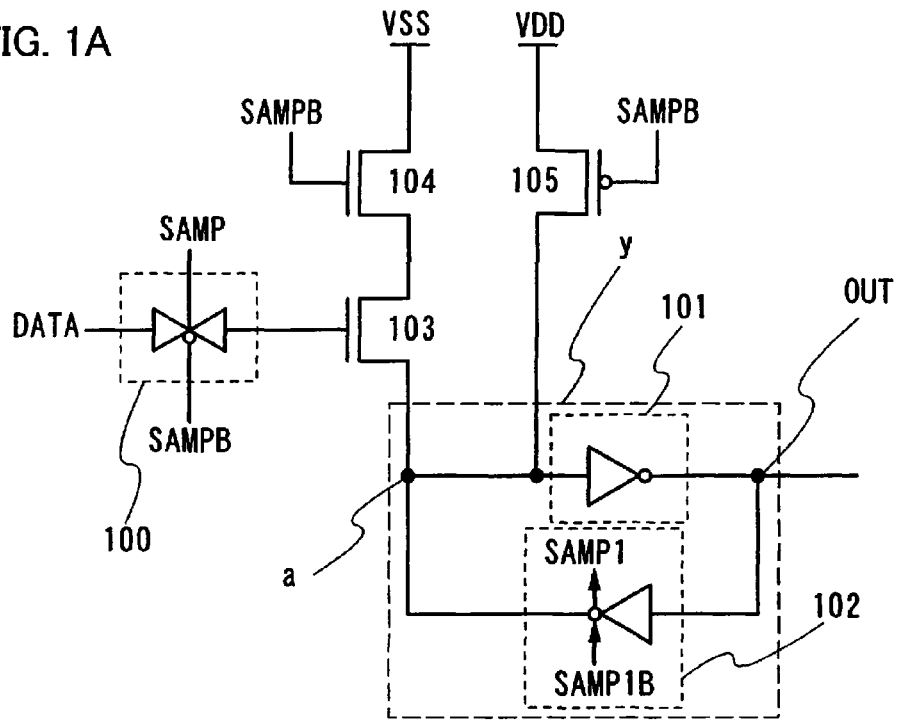
FIGS. 1A and 1B show an example of a structure of a data latch circuit of the present invention and operation timing thereof.
Figure 15A:
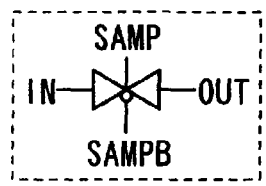
FIGS. 15A to 15C are equivalent circuit diagrams of circuit symbols used in FIGS. 1A and 1B.
Figure 15A:
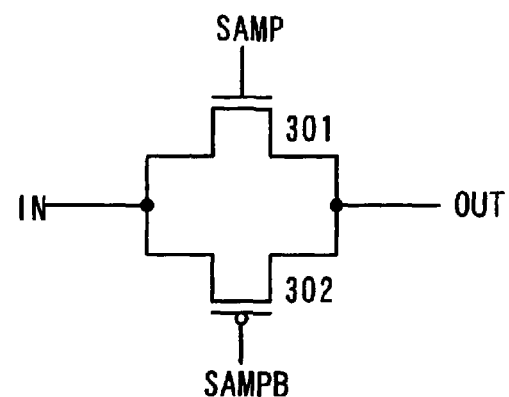
Figure 15B:
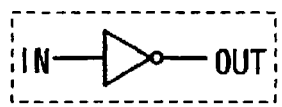
Figure 15B:
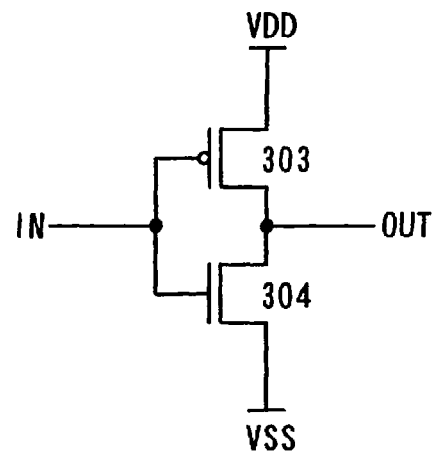
Figure 15C:
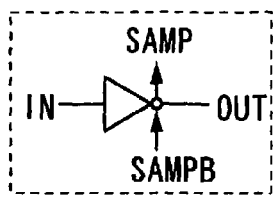
Figure 15C:
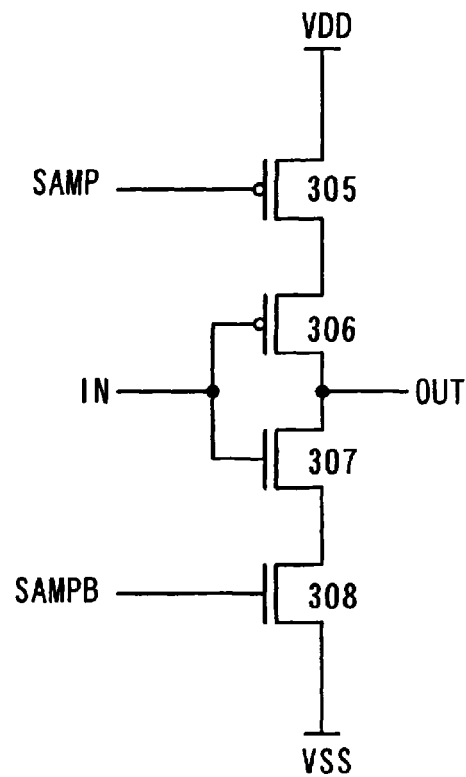

FIG. 1A shows a structure of a data latch circuit of an embodiment mode of the present invention. Equivalent circuits of circuit symbols used in FIG. 1A are shown in FIGS. 15A to 15C. FIG. 15A shows an analog switch, and its equivalent circuit has a structure including an n-channel TFT 301 and a p-channel TFT 302. FIG. 15B shows an inverter, and its equivalent circuit has a structure including an n-channel TFT 304 and a p-channel TFT 303. FIG. 15C shows a clocked inverter, and its equivalent circuit has a structure including n-channel TFTs 307 and 308 and p-channel TFTs 305 and 306. The data latch circuit has an analog switch 100 for sampling a data (DATA) signal, and an n-channel TFT 103 which is turned on or off according to a high (H) level or a low (L) level of the data (DATA) signal. The data latch circuit has an n-channel TFT 104 for outputting VSS by an inverted sampling (SAMPB) signal, and a p-channel TFT 105 for outputting VDD by the inverted sampling (SAMPB) signal. The analog switch 100 is turned on or off according to the sampling (SAMP) signal and the inverted sampling (SAMPB) signal. First electrodes of the n-channel TFT 104 and the p-channel TFT 105 are connected to VSS and VDD, respectively. A second electrode of the n-channel TFT 104 is connected to a first electrode of the n-channel TFT 103. Each of second electrodes of the n-channel TFT 103 and the p-channel TFT 105 is connected to an input terminal of the inverter 101 and an output terminal of the clocked inverter 102.

Figure 1B:
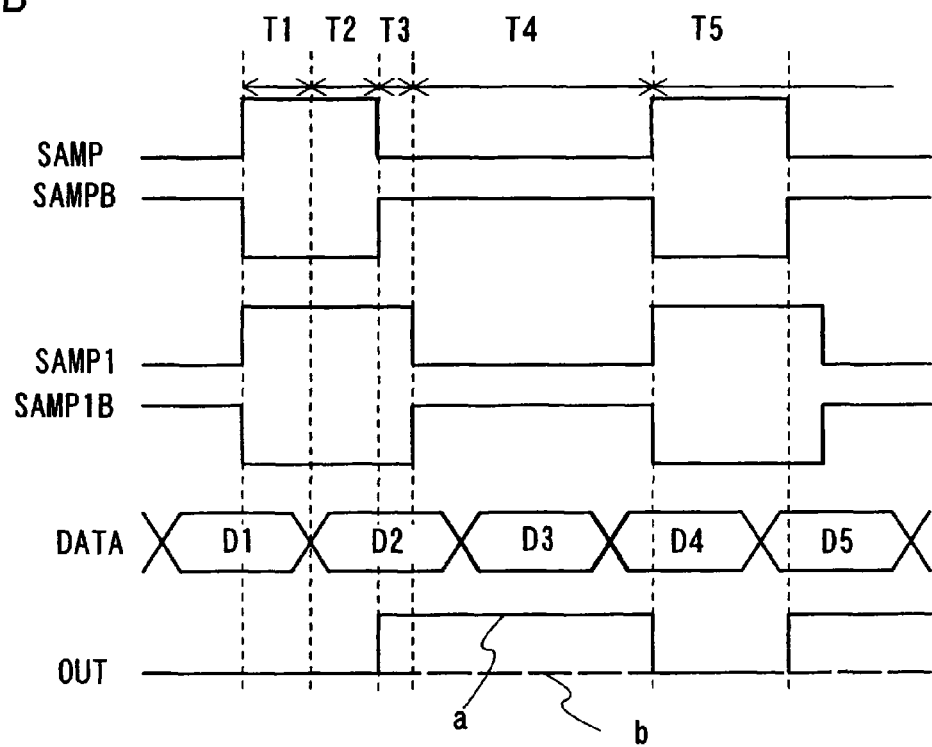
Figure 2A:
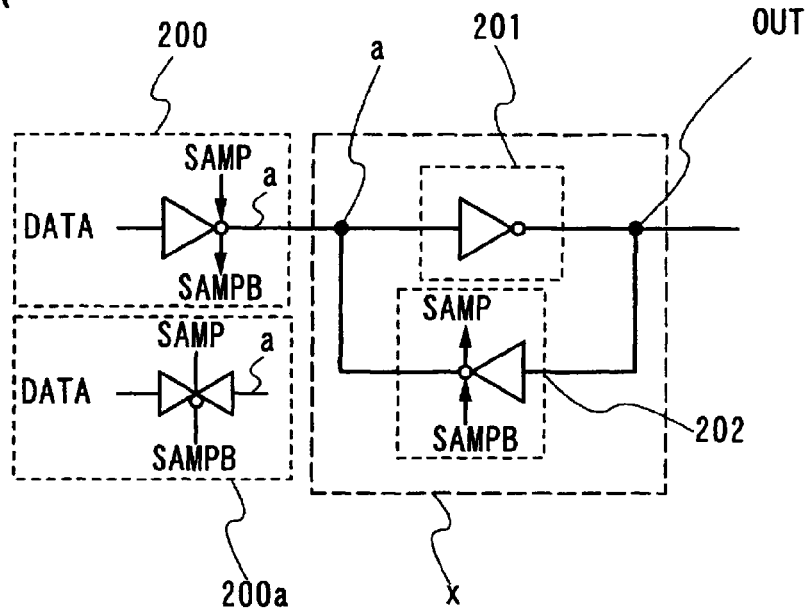
FIGS. 2A and 2B show an example of a structure of a conventional data latch circuit and operation timing thereof.
Figure 2B:
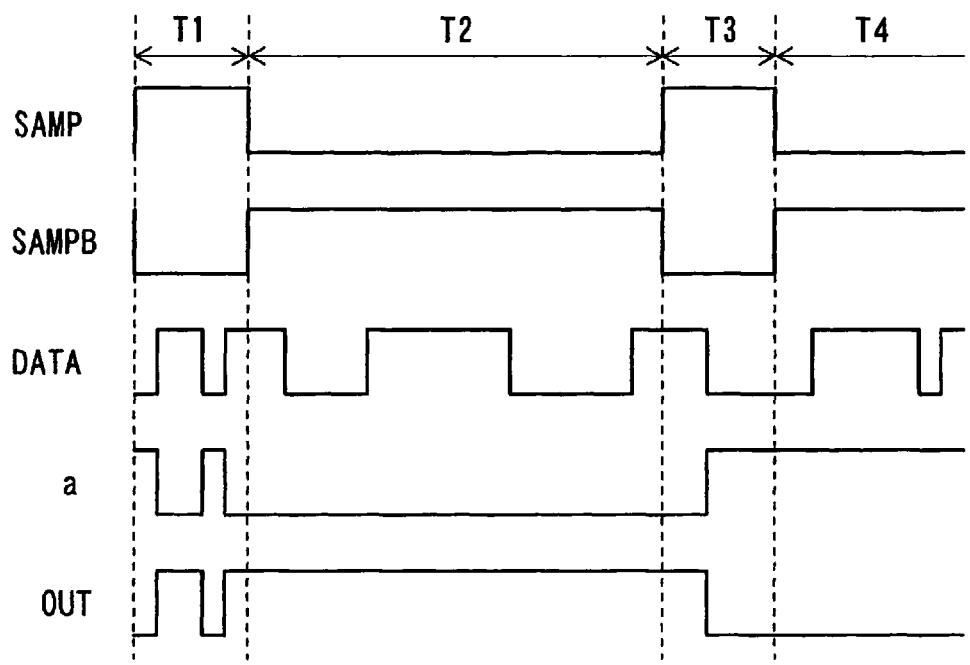

The connection portion is shown by "a" in FIG. 1A, which is hereinafter shown as a "node a". An output terminal of the inverter 101 is connected to an input terminal of the clocked inverter 102. The connection portion thereof is shown by OUT in FIG. 1A. The inverter 101 and the clocked inverter 102 correspond to "y" in FIG. 1A, which is hereinafter referred to as a "holding block y". In FIG. 1B, "a" is hereinafter referred to as an "output a" while "b" is hereinafter referred to as an "output b".

First, operation of a circuit by the sampling (SAMP) signal and the inverted sampling (SAMPB) signal is described with reference to FIG. 1A.

Operation when the sampling (SAMP) signal is at a high (H) level and the inverted sampling (SAMPB) signal is at a low (L) level is described. At this time, the analog switch 100 is turned on (the n-channel TFT 301 and the p-channel TFT 302 in the equivalent circuit in FIG. 15A are turned on, respectively). Accordingly, the data (DATA) signal is sampled and the data (DATA) signal is inputted to a gate electrode of the n-channel TFT 103. A low (L) level (0 V) of the inverted sampling (SAMPB) signal is inputted to a gate electrode of the p-channel TFT 105. The first electrode (source electrode) of the p-channel TFT has a potential of VDD (5 V) and Vgs is higher than threshold voltage, thereby turning on the p-channel TFT 105 to output VDD to the "node a". To a gate electrode of the n-channel TFT 104 is also inputted a low (L) level of the inverted sampling (SAMPB) signal. The first electrode (source electrode) of the n-channel TFT 104 has a potential of VSS (0 V) and Vgs is lower than threshold voltage, thereby turning off the n-channel TFT 104. Therefore, the VDD of the "node a" is determined regardless of whether the data (DATA) signal is at the high (H) level or the low (L) level.

On the other hand, operation when the sampling (SAMP) signal is at the low (L) level and the inverted sampling (SAMPB) signal is at the high (H) level is described. At this time, the analog switch 100 is turned off (the n-channel TFT 301 and the p-channel TFT 302 of the analog switch 100 are turned off, respectively). This stops the sampling of the data (DATA) signal, and the input of the data (DATA) signal to the gate electrode of the n-channel TFT 103 stops. To the gate electrode of the n-channel TFT 104 is inputted a high (H) level (5 V) of the inverted sampling (SAMPB) signal, and the first electrode (source electrode) thereof has a potential of VSS (0 V). Since Vgs is higher than threshold voltage, the n-channel TFT 104 is turned on and VSS is outputted to the first electrode of the n-channel TFT 103. The high (H) level (5 V) of the inverted sampling (SAMPB) signal is also inputted to the gate electrode of the p-channel TFT 105. The first electrode (source electrode) thereof has a potential of VDD (5 V) and Vgs is lower than threshold voltage, thereby turning off the p-channel TFT 105.

At this time, if the data (DATA) signal sampled by the analog switch 100 is at the high (H) level, the gate potential of the n-channel TFT 103 is 3.3 V while the potential of the first electrode (source electrode) thereof is VSS (0 V). Since Vgs is higher than threshold voltage, the n-channel TFT 103 is turned on and VSS of the first electrode is outputted to the "node a". If the data (DATA) signal is at the low (L) level, the gate potential of the n-channel TFT 103 is 0 V while the potential of the first electrode (source electrode) thereof is VSS (0 V). Since Vgs is lower than threshold voltage, the n-channel TFT 103 is turned off. Therefore, if the data (DATA) signal is at the high (H) level, the VSS of the "node a" is determined. On the contrary, if the data (DATA) signal is at the low (L) level, the potential of the "node a" is VDD.

Next, a timing chart of the data latch circuit of this embodiment mode is shown in FIG. 1B. In FIG. 1B, "a" is hereinafter referred to as an "output a" while "b" is hereinafter referred to as an "output b". Operation for holding voltages of the "node a" and the OUT is described in detail with reference to FIGS. 1A and 1B.

At the beginning of the T1 period, the timing of each signal is as follows: the sampling (SAMP) signal is at the high (H) level, the inverted sampling (SAMPB) signal is at the low (L) level, the sampling 1 (SAMP1) signal is at the high (H) level, and the inverted sampling 1 (SAMP1B) signal is at the low (L) level, wherein the respective signals are switched at the same time. It is not always necessary to carry out this switching at the same time. However, if the analog switch 100 and the clocked inverter 102 are both turned on at the same time, the output of the clocked inverter 102 superposes with the outputs of the n-channel TFT 103 and the p-channel TFT 105, resulting in that desired operation cannot be conducted. On the contrary, depending on an anteroposterior relation among the timings of the sampling (SAMP) signal, the inverted sampling (SAMPB) signal, the sampling 1 (SAMP1) signal, and the inverted sampling 1 (SAMP1B) signal, there appears a period in which both of the analog switch 100 and the clocked inverter 102 are turned off. In this case, the "node a" is in a floating state; however, the potential of the "node a" does not fluctuate immediately although the "node a" is floated for a moment. Therefore, the period in which both of them are turned off may be shortened. In consideration of the timing as above, the operation is not affected.

The T1 and T2 periods are described. During the T1 and T2 periods, since the sampling (SAMP) signal is at the high (H) level and the inverted sampling (SAMPB) signal is at the low (L) level, the data (DATA) signal is sampled by the analog switch 100. When the T2 period starts after the termination of the T1 period, the data (DATA) signal remains inverted; however, since the sampling (SAMP) signal is at the high (H) level and the inverted sampling (SAMPB) signal is at the low (L) level in this period, the "node a" outputs VDD regardless of the level of the data (DATA) signal as aforementioned. Moreover, since the sampling 1 (SAMP1) signal and the inverted sampling 1 (SAMP1B) signal for controlling the clocked inverter 102 are at the high (H) level and the low (L) level, respectively, the output has high impedance. By these operation, the low (L) level where the "node a" is inverted is outputted to the OUT in the T1 and T2 periods.

After the termination of the T2 period, the sampling (SAMP) signal is at the low (L) level and the inverted sampling (SAMPB) signal is at the high (H) level. Therefore, sampling the data (DATA) signal stops. At this time, the first electrode of the n-channel TFT 103 is VSS and the level of the data (DATA) signal (D2) which has been sampled by the analog switch 100 just before the termination of the T2 period is held in the gate electrode of the n-channel TFT 103.

Operation when the high (H) level of the data (DATA) signal (D2) is inputted to the gate electrode of the n-channel TFT 103 just before the termination of the T2 period is described. As mentioned above, the n-channel TFT 103 is turned on to output VSS to the "node a". Moreover, VDD is outputted to the OUT by the inverter 101. Subsequently, a T3 period starts. Since the sampling 1 (SAMP1) signal is at the high (H) level and the inverted sampling 1 (SAMP1B) signal is at the low (L) level in the clocked inverter 102 in the holding block y, the clocked inverter 102 has high impedance. Moreover, since the sampling (SAMP) signal is at the low (L) level and the inverted sampling (SAMPB) signal is at the high (H) level in the analog switch 100, the analog switch 100 has high impedance. That is to say, the T3 period includes a period where both of the analog switch 100 and the clocked inverter 102 are turned off.

In this case, the "node a" is in a floating state; however, since a period where the timing of the signal is displaced is extremely short, the potential of the "node a" does not fluctuate immediately as a result of the instant floating. When a T4 period starts after the termination of the T3 period, the sampling 1 (SAMP1) signal is at the low (L) level and the inverted sampling 1 (SAMP1B) signal is at the high (H) level, and a clocked inverter 102 functions as an inverter. Since the inverter 101 and the clocked inverter 102 form feedback in which their outputs hold potentials of the OUT and the "node a" (VSS), the OUT has VDD during the T4 period until the clocked inverter 102 has high impedance again. In this way, the OUT can hold VDD depending on the high (H) level of the data (DATA) signal sampled just before the termination of the T2 period.

In contrast, operation when the low (L) level of the data (DATA) signal (D2) is inputted to the gate electrode of the n-channel TFT 103 just before the termination of the T2 period is described. As mentioned above, the n-channel TFT 103 is turned off to make the "node a" output VDD. VSS is supplied to the OUT by the inverter 101. As described above, the "node a" floats for a moment in the T3 period; however, since the period where the signal is displaced is short, the potential of the "node a" does not fluctuate. When the T4 period starts after the termination of the T3 period, the sampling 1 (SAMP1) signal is at the low (L) level and the inverted sampling 1 (SAMP1B) signal is at the high (H) level; therefore the clocked inverter 102 functions as an inverter. The inverter 101 and the clocked inverter 102 form feedback in which their outputs hold the OUT and the "node a" (VDD), and the OUT has VSS ("output b") in the T4 period. In this way, the OUT can hold VSS depending on the low (L) level of the data (DATA) signal sampled just before the termination of the T2 period. Since the operation is repeated at the timing of T1 to T4 periods after a T5 period, the description is omitted.

The above operation is repeated depending on the states of the sampling (SAMP) signal, the inverted sampling (SAMPB) signal, the sampling 1 (SAMP1) signal, and the inverted sampling 1 (SAMP1B) signal, so that sampling and holding the data (DATA) signal are repeated.

By the above operation, the data latch circuit of the present invention has the following advantages as compared with conventional data latch circuits.

In the data latch circuit of this embodiment mode, only VSS (0 V) or VDD (5 V) of power source voltage is supplied to the "node a" and inputted to the inverter 101; therefore, the n-channel TFT and the p-channel TFT that form the inverter 101 exclusively operate certainly. Thus, incorrect through current does not flow to the inverter 101. Therefore, the holding operation can be very stable, and power consumption can be decreased by decreasing through current.

Another advantage is that the circuit operation is unlikely to depend on the variation in TFT characteristics caused by a manufacturing process of TFTs, particularly the variation in threshold voltage.

Since only the power source voltages of VDD and VSS are applied to the "node a" in the data latch circuit of this embodiment mode, a potential of 5 V is inputted to the inverter 101 and Vgs of the n-channel TFT 304 is 5 V, which is higher than the threshold voltage. Thus, the n-channel TFT 304 is turned on. Moreover, since Vgsp of the p-channel TFT 303 is 0 V, the p-channel TFT 303 is turned off. Therefore, the output of the inverter 101 is VSS and incorrect through current does not flow between the power source voltages of VDD-VSS, which makes it possible to operate certainly. As compared with conventional circuit structures, the present invention can provide a circuit structure which is unlikely to depend on the variation in threshold voltage.

In FIG. 1A showing this embodiment mode, in the T3 period in FIG. 1B, the VDD is supplied to the "node a" when the level of voltage of the data (DATA) signal is a low (L) level just before the termination of the T2 period in FIG. 1B. Then, the timing and circuit have such a structure that VSS is supplied to the "node a" when the level of the voltage of the data (DATA) signal is the high (H) level. Therefore, the power source voltages of the VDD and VSS are inputted depending on the data (DATA) to allow the circuit to operate certainly. Thus, as mentioned above, the circuit operation does not depend on the threshold voltage of the TFT, differently from the conventional circuit.

In this way, since the dependency on the threshold voltage of the TFT is less than in the conventional data latch circuits, a circuit structure which is highly resistant against the variation in threshold voltage can be obtained.

Figure 4:
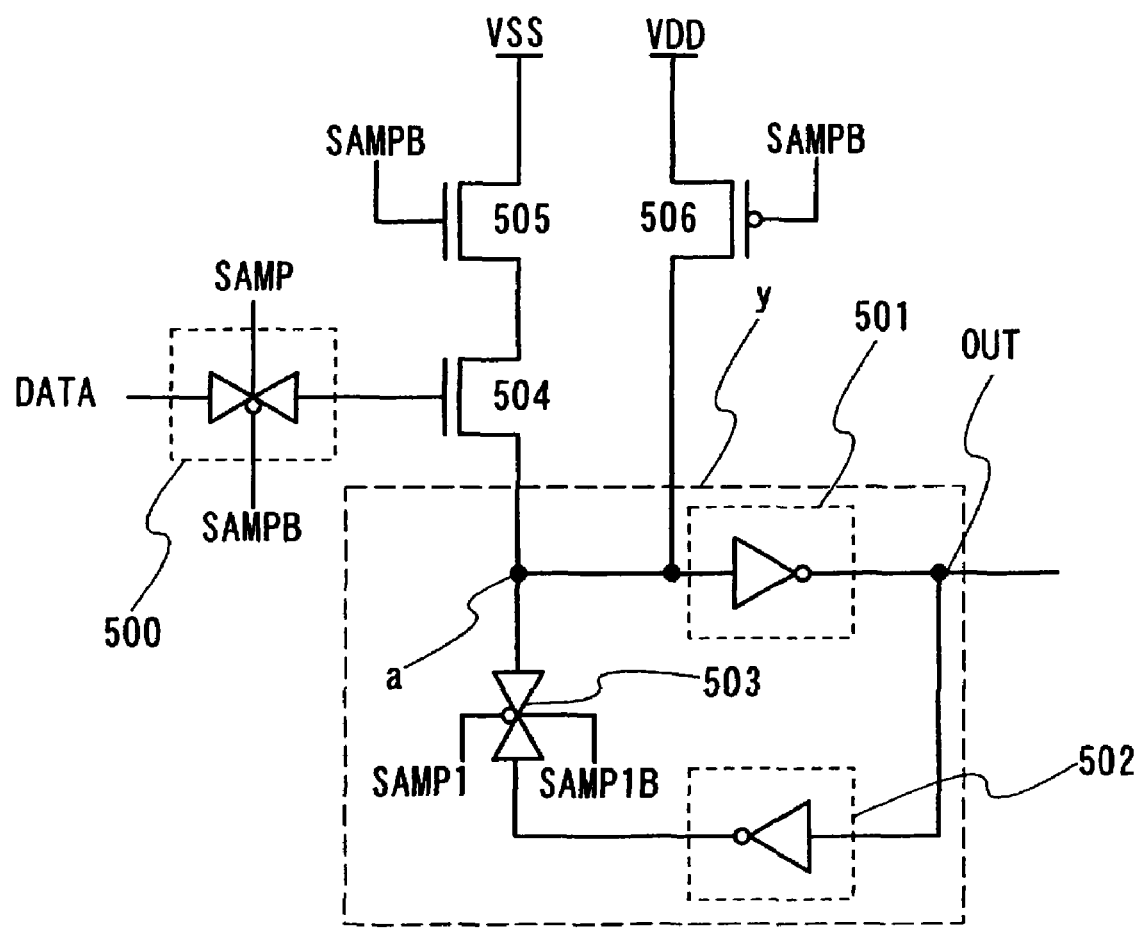
FIG. 4 shows an example of a structure of a data latch circuit of the present invention.

Moreover, a structure in which the structure in this embodiment mode has been partially modified is shown in FIG. 4. Although the holding block y is formed with the inverter and the clocked inverter, an analog switch and an inverter are used instead of the clocked inverter. The others operate at the timing shown in FIG. 1B; therefore the description is omitted.

Figure 3:
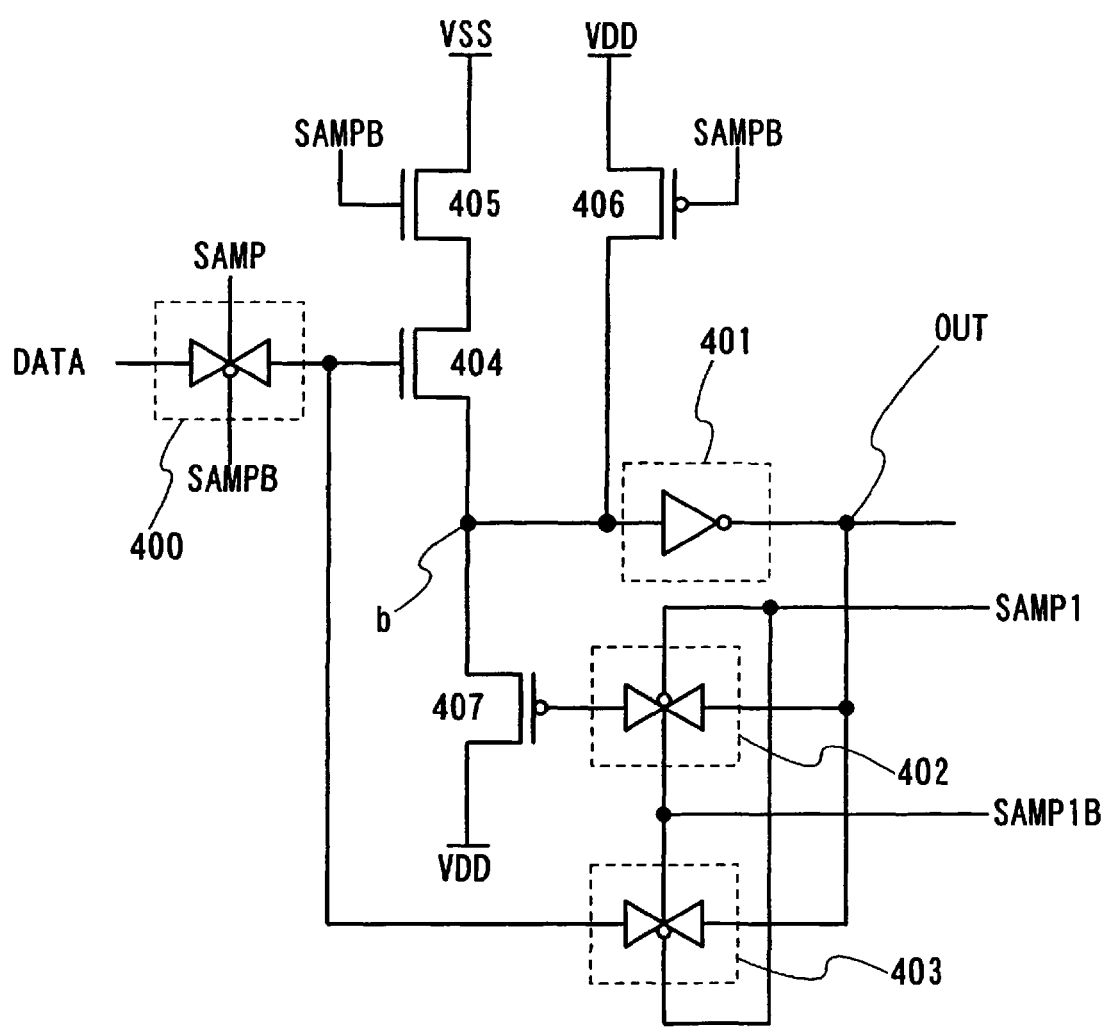
FIG. 3 shows an example of a structure of a data latch circuit of the present invention.

Another mode of the data latch circuit is shown in FIG. 3. The data latch circuit shown in FIG. 3 has a structure in which an inverter 401, analog switches 402 and 403, and a p-channel TFT 407 are connected to each other instead of the holding block y. VDD is connected to a first electrode of the p-channel TFT 407, a second electrode thereof is connected to a second electrode of an n-channel TFT 404 and an input terminal of the inverter 401, and a gate electrode thereof is connected to one of input/output terminals of the analog switch 402. The other of the input/output terminals of the analog switch 402 is connected to an OUT, which is an output terminal of the inverter 401, and connected to one of input/output terminals of the analog switch 403. The other of the input/output terminals of the analog switch 403 is connected to the gate electrode of the n-channel TFT 404. The other structures are the same as that of the data latch circuit shown in FIG. 1A.

Control signals (a sampling (SAMP) signal, an inverted sampling (SAMPB) signal, a sampling 1 (SAMP1) signal, and an inverted sampling 1 (SAMP1B) signal) operate at a similar timing to that in the timing chart shown in FIG. 1B. Hereinafter, "b" shown in FIG. 3 is referred to as a "node b". Since the operation in the T1 to T3 periods is the same as that in the embodiment mode shown in FIG. 1A, the description is omitted.

Operation when the VSS is supplied to the "node b" in the T3 period, i.e., operation when the data (DATA) signal (D2) is at a high (H) level is described. At the beginning of the T4 period, the sampling 1 (SAMP1) signal is at a low (L) level and the inverted sampling 1 (SAMP1B) signal is at a high (H) level, whereby the analog switches 402 and 403 remain on. VSS is supplied to the "node b" and VDD is supplied to the OUT by the inverter 401. Since the analog switches 402 and 403 are turned on, VDD is inputted to the gate electrode of the p-channel TFT 407, whereby the p-channel TFT 407 is turned off. Meanwhile, VDD (5 V) is inputted to the gate electrode of the n-channel TFT 404 and the potential of the first electrode thereof (source electrode) is VSS (0 V). Since Vgs is higher than threshold voltage, the n-channel TFT 404 is turned on. Thus, VSS is outputted to the "node b" by the n-channel TFT 404. At this time, the n-channel TFT 404, the n-channel TFT 405, the inverter 401, and the analog switch 403 form feedback. That is to say, the state of the "node b" is determined by the n-channel TFT 404 and n-channel TFT 405, and the state of the OUT is determined by the inverter 401. This state continues during the T4 period, and the OUT has an "output a" as shown in FIG. 1B.

Similarly, operation when VDD is supplied to the "node b", i.e., operation when the data (DATA) signal (D2) is at a low (L) level is described. At the beginning of the T4 period, the analog switches 402 and 403 remains on as mentioned above. At this time, VDD is supplied to the "node b" and VSS is supplied to the OUT by the inverter 401. The VSS of the OUT is inputted to the gate electrodes of the p-channel TFT 407 and the n-channel TFT 404 through the analog switches 402 and 403, respectively. The gate potential of the p-channel TFT 407 is VSS (0 V) while the first electrode thereof (source electrode) has a potential of VDD (5 V). Since Vgs is higher than threshold voltage, the p-channel TFT 407 is turned on. The gate potential of the n-channel TFT 404 is VSS (0 V) while the potential of the first electrode thereof (source electrode) is VSS (0V). Since Vgs is lower than threshold voltage, the n-channel TFT 404 is turned off. Thus, VDD is outputted to the "node b" by the p-channel TFT 407. At this time, feedback is formed by the p-channel TFT 407, the inverter 401, and the analog switch 402. That is to say, the state of the "node b" is determined by the p-channel TFT 407 and the OUT is determined by the inverter 401. This state continues during the T4 period, and the OUT has an "output b".

When the high (H) level of the data (DATA) signal is held in this way, feedback is formed by the n-channel TFT 404, the analog switch 403, and the inverter 401. On the other hand, when the low (L) level of the data (DATA) signal is held, feedback is formed by the p-channel TFT 407, the analog switch 402, and the inverter 401. By fixing the gate electrodes of the n-channel TFT 404 and the p-channel TFT 407 in this way to form two of the feedback for holding, the circuit operation can be stable and the circuit can be operated certainly.

Embodiment Mode 2

This embodiment mode will describe an example of using the data latch circuit employed in this embodiment mode in a source signal line driver circuit. The source signal line driver circuit is to sample a data signal to be inputted and output a signal which has been analog-converted to a source line corresponding to a pixel to be driven.

Figure 5:
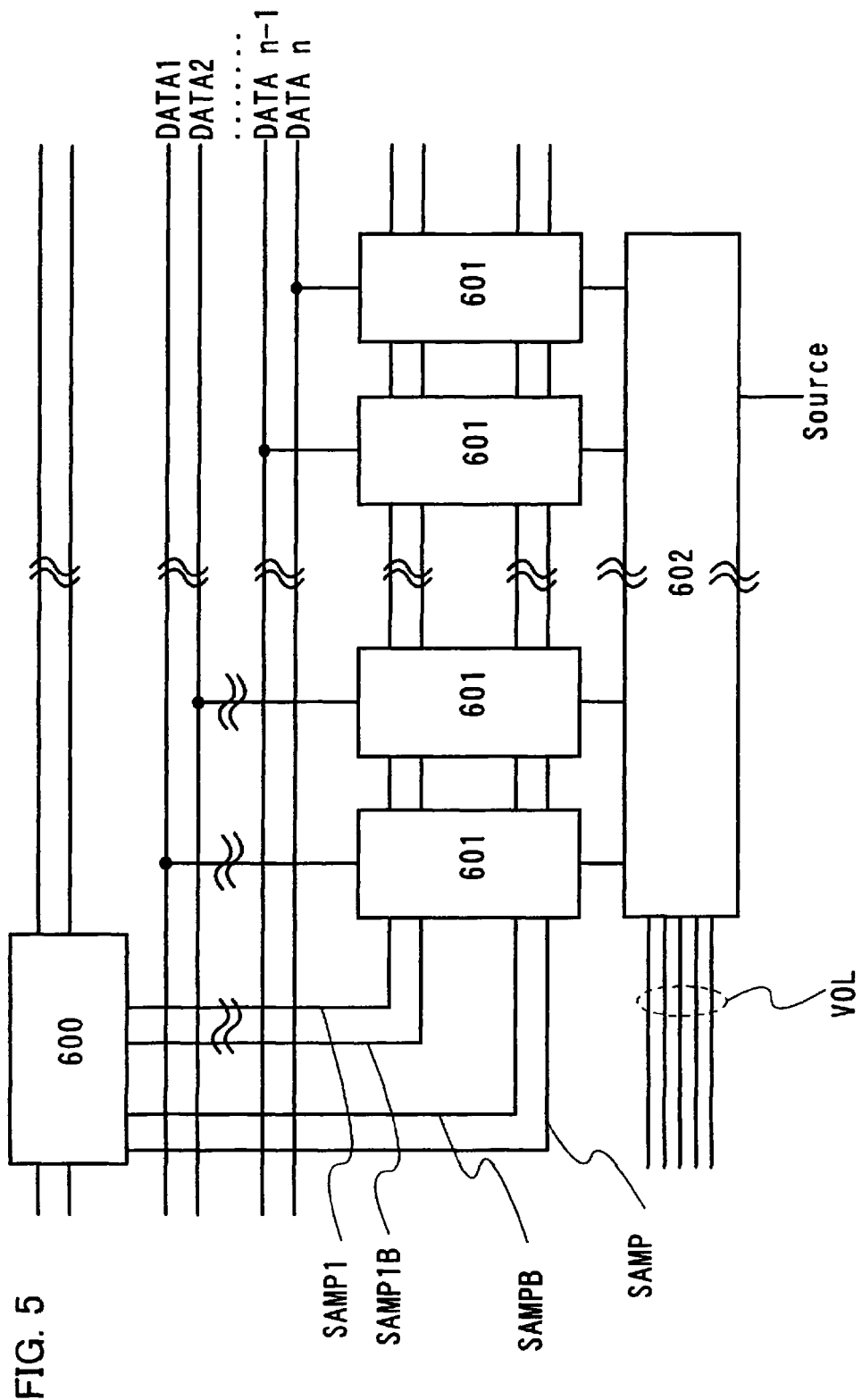
FIG. 5 shows a structure of a source signal line driver circuit to which a data latch circuit of the present invention can be applied.

FIG. 5 shows an example of a structure of a source signal line driver circuit. The source signal line driver circuit often includes a shift register 600, a latch circuit 601, and a D/A converting circuit (Digital/Analog Converter: DAC) 602. Usually, in the source signal line driver circuit, some level shifters are additionally needed to amplify a data signal when operating the latch circuit; however, the level shifters are not necessary in the present invention. The source lines with the number corresponding to the number of rows of pixels are necessary in the actual source driver; therefore, a source driver portion in a display device includes the circuits shown in FIG. 5 arranged with the same number as the rows.

The sampling signal (SAMP) and the inverted sampling signal (SAMPB) which have been sent from the shift register 600 are inputted to the latch circuit 601. The latch circuit 601 holds and outputs a data signal (DATA) from an external circuit inputted depending on a sampling signal (SAMP), an inverted sampling signal (SAMPB), and a sampling 1 (SAMP1) signal and an inverted sampling 1 (SAMP1B) signal for controlling the clocked inverter in the latch circuit and sends the data signal (DATA) to the D/A converting circuit. One or two from among a plurality of power source grayscale lines (VOL) is/are selected depending on the output from a plurality of latch circuits in the D/A converting circuit, and voltage within the voltage range is selected and outputted to a source line (Source).

The shift register includes a plurality of inverters and clocked inverters, and outputs an inputted signal after shifting the inputted signal for one cycle or a ½ cycle. As the shift register, a known shift register can be used. The D/A converting circuit converts a digital signal into an analog signal and can have various modes in accordance with the structure. Similarly to the shift register, a known D/A converting circuit may be used. An analog buffer may be provided after the DAC.

Further, although this embodiment mode has described an example of analog-outputting a signal which has been digital-inputted, it is also possible, naturally, to digital-output a signal which has been digital-inputted.

Embodiment Mode 3

Figure 6A:
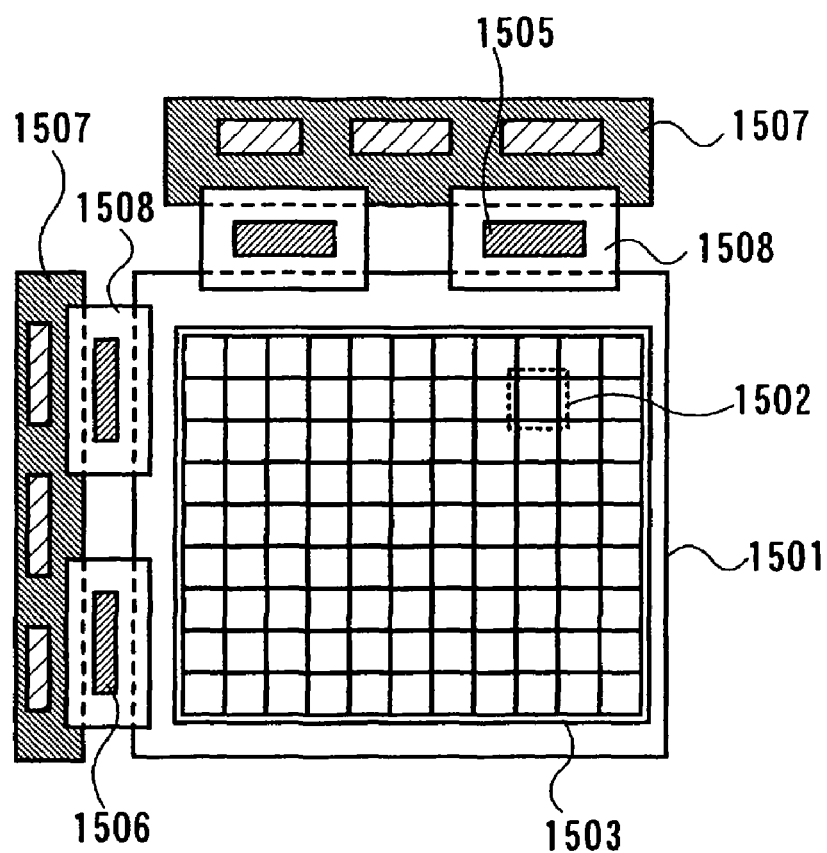
FIGS. 6A and 6B show structures of display devices of Embodiment Mode 3.
Figure 6B:
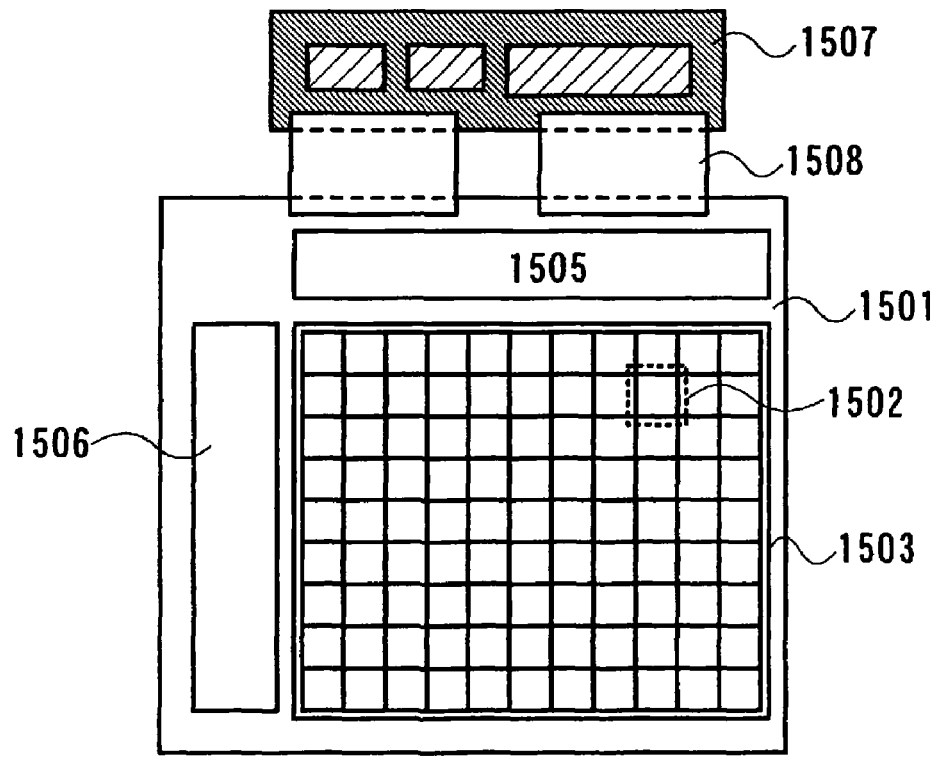

This embodiment mode will describe, with reference to FIGS. 6A and 6B, a display device including the data latch circuit shown in Embodiment Modes 1 and 2, of which a display screen is formed by applying to a pixel a light-emitting element using a material expressing electroluminescence.

In FIG. 6A, a display panel 1501 has a pixel portion 1503 including a plurality of pixels 1502 arranged in matrix. Each pixel 1502 has a switching element such as a TFT and a light-emitting element connected thereto. A connection wire 1508 which connects an external circuit 1507 and the display panel 1501 may have driver ICs mounted, which form a signal line driver circuit 1505 and a scan line driver circuit 1506. The data latch circuit shown in Embodiment Modes 1 and 2 is incorporated in the driver IC.

As another mode, the signal line driver circuit 1505 and the scan line driver circuit 1506 can be provided over a substrate where the pixel portion 1503 is formed, as shown in FIG. 6B. These driver circuits are formed with TFTs same as the pixel 1502 and can be formed with p-channel TFTs and n-channel TFTs. The data latch circuit shown in Embodiment Modes 1 and 2 is formed with TFTs. In this case, it is preferable that channel-formation regions of the TFTs are formed with a polycrystalline semiconductor.

Such a display device includes a data latch circuit in which the power consumption is reduced by reducing through current, which is not affected by the variation in TFT characteristics, and which can operate certainly. Thus, boosting the external circuit is no longer necessary, and it is possible to decrease the power consumption, the layout area, and the cost.

Embodiment Mode 4

Figure 7A:
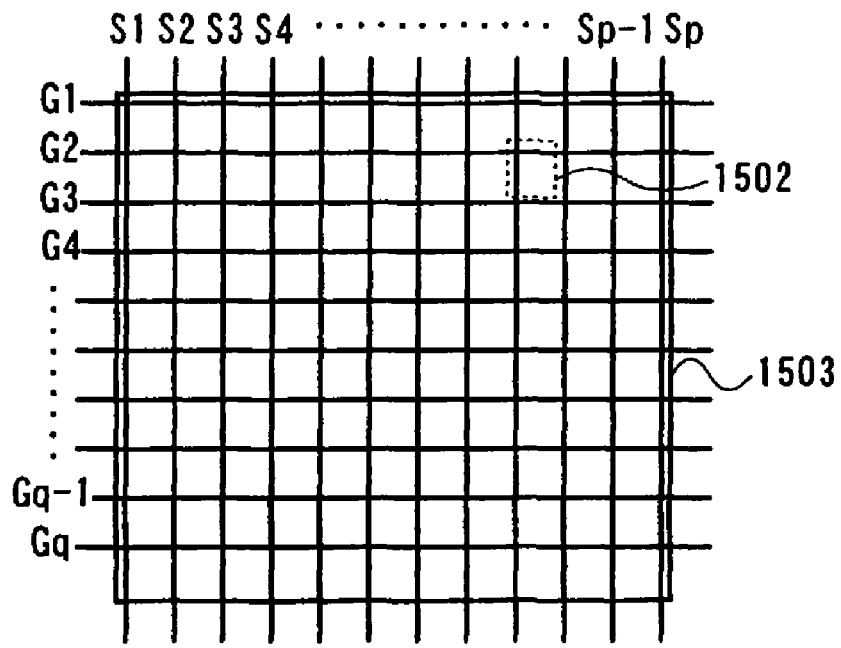
FIGS. 7A and 7B show an example of a structure of a pixel portion in a display device shown in FIG. 6A or 6B.

FIG. 7A shows an example of a structure of the pixel portion 1503 shown in FIGS. 6A and 6B (hereinafter referred to as a first pixel structure). The pixel portion 1503 includes a plurality of signal lines $S_1$ to $S_p$ (p is a natural number), a plurality of scan lines $G_1$ to $G_q$ (q is a natural number) provided so as to intersect with the plurality of signal lines $S_1$ to $S_p$, and pixel portions 1502 provided for every intersection of the signal lines $S_1$ to $S_p$ and the scan lines $G_1$ to $G_q$. In this case, the pixel 1502 indicates a region including a region compartmentalized by being surrounded by the signal line and the scan line.

Figure 7B:
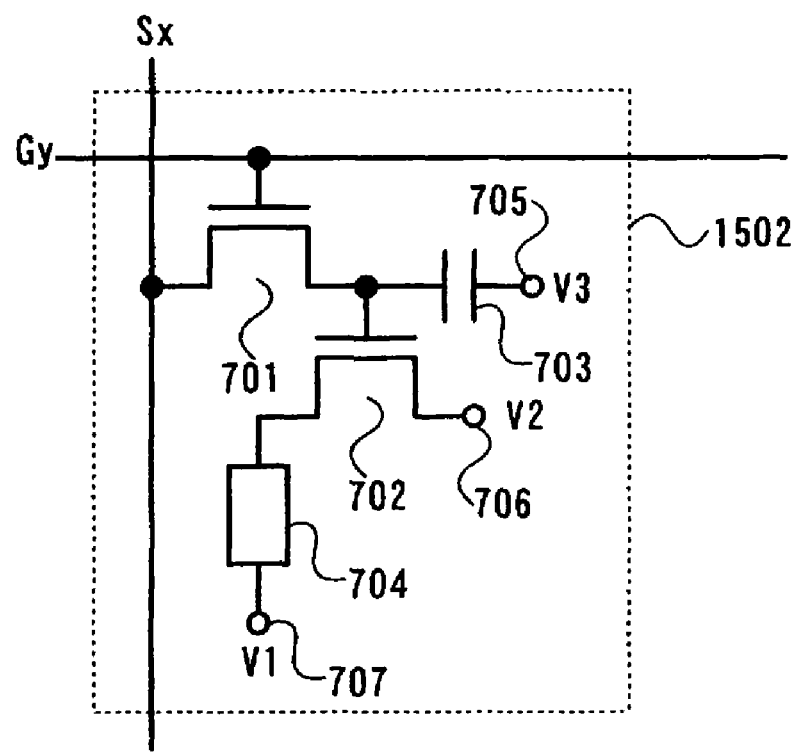

The structure of the pixel 1502 shown in FIG. 7A is shown in FIG. 7B. FIG. 7B shows the pixel 1502 formed at an intersection of one $S_x$ (x is a natural number of p or less) selected from the plurality of signal lines $S_1$ to $S_p$ and one $G_y$ (y is a natural number of q or less) selected from the plurality of scan lines $G_1$ to $G_q$. The pixel 1502 has a first TFT 701, a second TFT 702, a capacitor element 703, and a light-emitting element 704. This embodiment mode shows an example of using an element, as the light-emitting element 704, having a pair of electrodes and emitting light by feeding current between the pair of electrodes. Moreover, parasitic capacitance of the second TFT 702, and the like may be used actively as the capacitor element 703. The first TFT 701 and the second TFT 702 may be either n-channel TFTs or p-channel TFTs.

A gate of the first TFT 701 is connected to the scan line $G_y$, and one of a source and a drain of the first TFT 701 is connected to the signal line $S_x$ while the other is connected to a gate of the second TFT 702 and one electrode of the capacitor element 703. The other electrode of the capacitor element 703 is connected to a terminal 705 to which a potential $V_3$ is applied. One of a source and a drain of the second TFT 702 is connected to one electrode of the light-emitting element 704 while the other is connected to a terminal 706 to which a potential $V_2$ is applied. The other electrode of the light-emitting element 704 is connected to a terminal 707 to which a potential $V_1$ is applied.

Operation of the pixel 1502 having such a structure can be described as follows. One of the plurality of scan lines $G_1$ to $G_q$ is selected and image signals are inputted to all of the plurality of signal lines $S_1$ to $S_p$ while the scan line is selected. In this way, the image signals are inputted to the pixels in one row of the pixel portion 1503. By conducting similar operation by sequentially selecting from the plurality of scan lines $G_1$ to $G_q$, the image signals are inputted to all the pixels 1502 in the pixel portion 1503.

Operation of the pixel 1502 in which the one $G_y$ of the plurality of scan lines $G_1$ to $G_q$ is selected and the image signal is inputted from the one $S_x$ of the plurality of signal lines $S_1$ to $S_p$ is described. When the scan line $G_y$ is selected, the first TFT 701 is turned on. An on-state of a TFT means a state that a source and a drain are electrically connected while an off-state of a TFT means a state that a source and a drain are electrically disconnected. When the first TFT 701 is turned on, an image signal inputted in the signal line $S_x$ is inputted to the gate of the second TFT 702 through the first TFT 701. Whether the second TFT 702 is turned on or off is selected depending on the inputted image signal. If the second TFT 702 is turned on, drain current of the second TFT 702 is fed to the light-emitting element 704, whereby the light-emitting element 704 emits light.

The potential $V_2$ and the potential $V_3$ are kept so that potential difference is always constant when the second TFT 702 is turned on. The potential $V_2$ and the potential $V_3$ may be the same potential. In the case where the potential $V_2$ and the potential $V_3$ are the same potential, the terminal 705 and the terminal 706 may be connected to the same wire. The potential $V_1$ and the potential $V_2$ are set so as to have predetermined potential difference when light emission of the light-emitting element 704 is selected. Thus, current is fed to the light-emitting element 704, whereby the light-emitting element 704 emits light.

Such a display device having the pixel portion 1503 has an advantageous effect by including the data latch circuit shown in Embodiment Mode 1 or 2, similarly to Embodiment Mode 3. That is to say, since the data latch circuit has a structure in which power consumption is reduced by reducing through current, which is not affected by the variation in TFT characteristics, and which can operate certainly, boosting an external circuit is no longer necessary and it is possible to decrease the power consumption, the layout area, and the cost.

Embodiment Mode 5

Figure 8A:
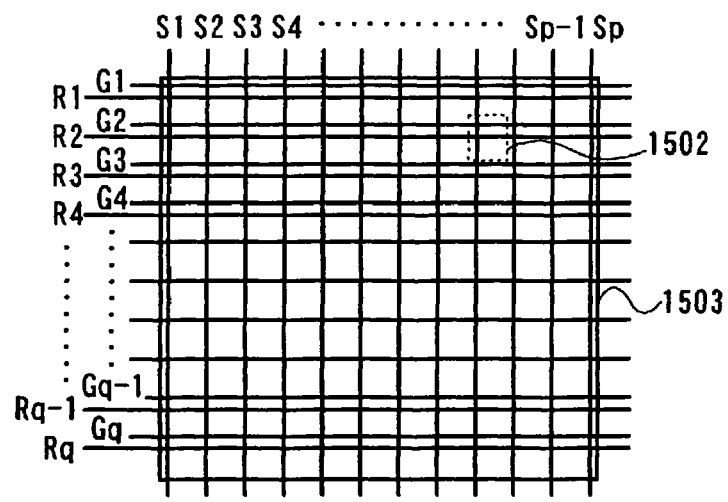
FIGS. 8A to 8C show examples of structures of pixel portions in display devices shown in FIGS. 6A and 6B.

FIG. 8A shows an example of another structure of the pixel portion 1503 shown in FIGS. 6A and 6B. The pixel portion 1503 includes a plurality of first signal lines $S_1$ to $S_p$ (p is a natural number), a plurality of scan lines $G_1$ to $G_q$ (q is a natural number) and a plurality of scan lines $R_1$ to $R_q$ all of which are provided so as to intersect with the plurality of scan lines $S_1$ to $S_p$, and a pixel 1502 provided for each intersection of the signal lines $S_1$ to $S_p$ and the scan lines $G_1$ to $G_q$.

Figure 8B:
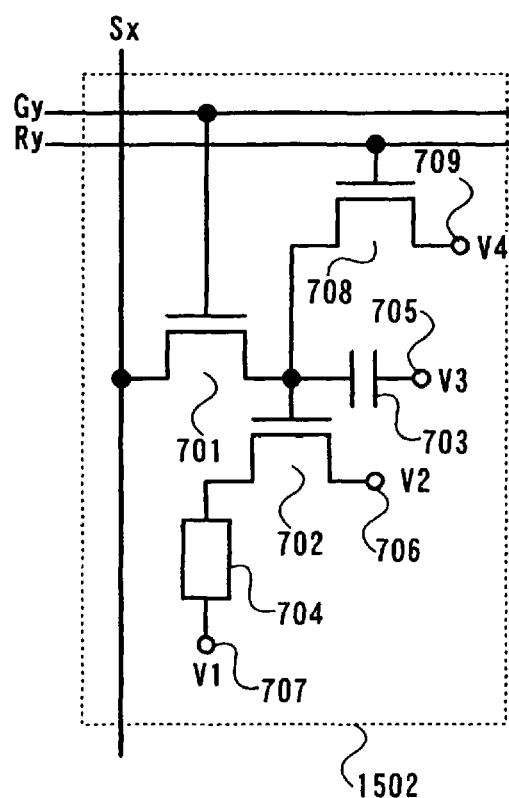

A structure of the pixel 1502 of FIG. 8A is shown in FIG. 8B. FIG. 8B shows the pixel 1502 formed at an intersection of one $S_x$ (x is a natural number of p or less) selected from the plurality of signal lines $S_1$ to $S_p$, one $G_y$ (y is a natural number of q or less) selected from the plurality of scan lines $G_1$ to $G_q$, and one $R_y$ selected from the plurality of scan lines $R_1$ to $R_q$. In the pixel having the structure shown in FIG. 8B, the same portion as that in FIG. 7B is denoted by the same reference numeral, and the description thereof is omitted. FIG. 8B is different from FIG. 7B in that a third TFT 708 is provided in the pixel 1502 shown in FIG. 7B. The third TFT 708 may be either a p-channel TFT or an n-channel TFT.

A gate of the third TFT 708 is connected to the scan line $R_y$, one of a source and a drain of the third TFT 708 is connected to a gate of the second TFT 702 and one electrode of the capacitor element 703, and the other is connected to a terminal 709 to which a potential $V_4$ is given.

The pixel having the structure shown in FIGS. 8A and 8B has a characteristic that the light-emitting element 704 in the pixel 1502 emits no light regardless of the image signal inputted from the signal line $S_x$, by having the scan line $R_y$ and the third TFT 708. By the signal inputted to the scan line $R_y$, the time for which the light-emitting element 704 in the pixel 1502 emits light can be set. Thus, a light-emitting period which is shorter than a period for selecting all the scan lines $G_1$ to $G_q$ by selecting the scan lines $G_1$ to $G_q$ sequentially. In this way, in the case of displaying according to a time division grayscale method, a short subframe period can be set, which makes it possible to express high grayscale.

The potential $V_4$ may be set so that the second TFT 702 is turned off when the third TFT 708 is turned on. For example, the potential $V_4$ can be set so as to be the same as the potential $V_2$ when the third TFT 708 is turned on. By setting the potential $V_2$ and the potential $V_4$ to be the same, charges held in the capacitor element 703 is released to make the voltage between the source and the gate of the second TFT 702 zero, whereby the second TFT 702 is turned off. In the case of setting the potential $V_2$ and the potential $V_4$ to be the same, the terminal 706 and the terminal 709 may be connected to the same wire.

The third TFT 708 is not limited to the arrangement shown in FIG. 8B. For example, the third TFT 708 may be disposed serially with the second TFT 702. In this structure, the third TFT 708 is turned off by the signal inputted to the scan line $R_y$, whereby current fed to the light-emitting element 704 is blocked. Thus, the light-emitting element 704 emits no light.

Figure 8C:
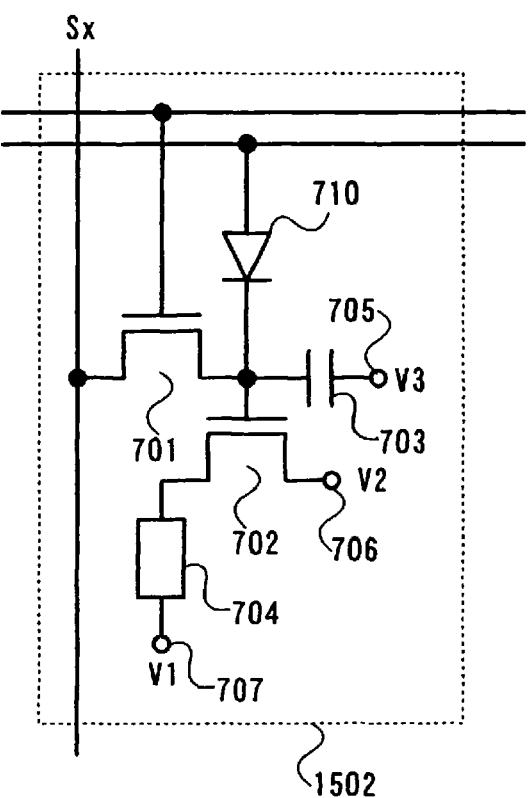

A diode may be used instead of the third TFT 708 shown in FIG. 8B. FIG. 8C shows a structure of a pixel using a diode instead of the third TFT 708. In FIG. 8C, the same part as that in FIG. 8B is denoted by the same reference numeral and the description thereof is omitted. One electrode of a diode 710 is connected to the scan line $R_y$, while the other electrode is connected to a gate of the second TFT 702 and one electrode of the capacitor element 703.

In the diode 710, current is fed from one electrode to the other electrode. The second TFT 702 is a p-channel TFT. By increasing the potential of one electrode of the diode 710, it is possible to increase the potential of the gate of the second TFT 702 to turn off the second TFT 702.

FIG. 8C has shown a structure of the diode 710 in which current is fed from one electrode connected to the scan line $R_y$ to the other electrode connected to the gate of the second TFT 702 and the second TFT 702 is a p-channel TFT. However, the present invention is not limited to this. The diode 710 may have a structure in which current is fed from the other electrode connected to the gate of the second TFT 702 to the one electrode connected to the signal line R$_y$ and the second TFT 702 is an n-channel TFT. When the second TFT 702 is an n-channel TFT, the potential of the one electrode of the diode 710 is lowered to lower the potential of the gate of the second TFT 702, whereby the second TFT 702 is turned off.

As the diode 710, a diode-connected TFT may be used. As the diode-connected TFT, a TFT of which a drain and a gate are connected to each other is shown. As the diode-connected TFT, either a p-channel TFT or an n-channel TFT may be used.

Such a display device having the pixel portion 1503 has an advantageous effect by including the data latch circuit shown in Embodiment Mode 1 or 2, similarly to Embodiment Mode 3. That is to say, since the data latch circuit has a structure in which the power consumption is reduced by reducing through current, which is not affected by the variation in TFT characteristics, and which can operate certainly, boosting an external circuit is no longer necessary and it is possible to decrease the power consumption, the layout area, and the cost.

Embodiment Mode 6

Figure 9:
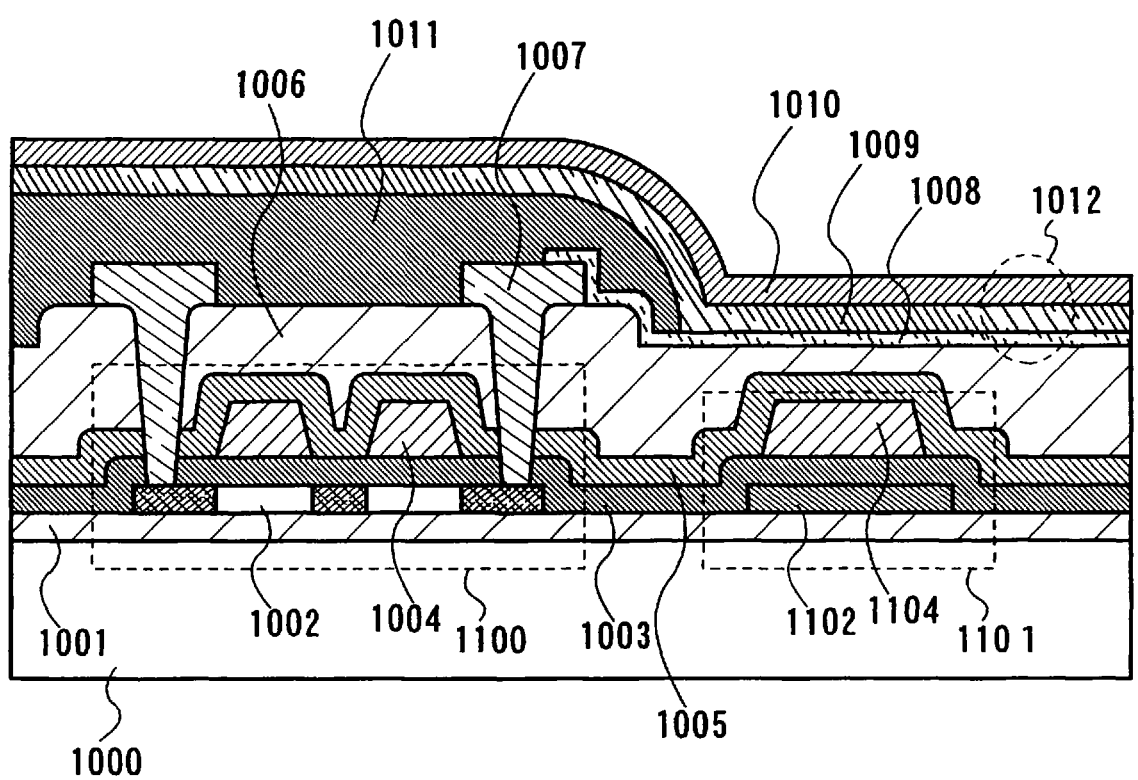
FIG. 9 shows an example of a structure of a pixel in a display device shown in FIG. 6A or 6B.

A mode of a structure of a pixel in the display device shown in Embodiment Modes 3 to 5 is described with reference to FIG. 9. FIG. 9 is a cross-sectional view of a pixel including a TFT and a light-emitting element connected to the TFT.

In FIG. 9, a blocking layer 1001, a semiconductor layer 1002 forming a TFT 1100, and the semiconductor layer 1002 forming one electrode of a capacitor portion 1101 are formed over a substrate 1000. A first insulating layer 1003 is formed thereover, which serves as a gate insulating layer in the TFT 1100 and serves as a dielectric layer for forming capacitance in the capacitor portion 1101.

Over the first insulating layer 1003, a conductive layer 1104 for forming a gate electrode 1004 and the other electrode of the capacitor portion 1101 is formed. A wire 1007 to be connected to the TFT 1100 is connected to a first electrode 1008 of a light-emitting element 1012. This first electrode 1008 is formed over a third insulating layer 1006. A second insulating layer 1005 may be formed between the first insulating layer 1003 and the third insulating layer 1006. The light-emitting element 1012 is formed with the first electrode 1008, an EL layer 1009, and a second electrode 1010. Further, a fourth insulating layer 1011 is formed so as to cover a peripheral end portion of the first electrode 1008 and a connection portion of the first electrode 1008 and the wire 1007.

Next, the detail of the structure shown above is described. As the substrate 1000, a glass substrate made of barium borosilicate glass, aluminoborosilicate glass, or the like, a quartz substrate, a ceramic substrate, or the like can be used. Moreover, a metal substrate including stainless steel or semiconductor substrate with its surface having an insulating film formed thereover may be used. Furthermore, a flexible substrate including synthetic resin such as plastic may be used. A surface of the substrate 1000 may be flattened by polishing such as a chemical mechanical polishing (CMP) method.

As the blocking layer 1001, an insulating film including silicon oxide, silicon nitride, silicon nitride oxide, or the like can be used. The blocking layer 1001 can prevent the diffusion of alkali-earth metal or alkali metal such as Na in the substrate 1000 into the semiconductor layer 1002 to cause an adverse effect on the characteristic of the TFT 1100. In FIG. 9, the blocking layer 1001 has a single-layer structure; however, the blocking layer 1001 may have two or more layers. If the diffusion of the impurities does not lead to any significant problem like in the case of a quartz substrate, the blocking layer 1001 is not always necessary.

The surface of the glass substrate may be directly treated in high-density plasma excited by microwaves under a condition in which the electron temperature is 2 eV or less, the ion energy is 5 eV or less, and the electron density ranges from $10^{11}/cm^3$ to $10^{13}/cm^3$. The plasma can be generated by a plasma treatment apparatus of microwave excitation, using a radial slot antenna. At this time, when nitrogen ($N_2$) or nitride gas such as ammonia ($NH_3$) or nitrogen suboxide ($N_2O$) is introduced, the surface of the glass substrate can be nitrided. Since this nitrided layer formed on the surface of the glass substrate contains silicon nitride as its main component, the nitrided layer can be used as the blocking layer against the impurities diffused from a glass substrate side. The blocking layer 1001 may be provided by forming a silicon oxide film or a silicon oxynitride film over this nitrided layer by a plasma CVD method.

In addition, by conducting a similar plasma treatment to the surface of the blocking layer 1001 formed with silicon oxide, silicon oxynitride, or the like, a nitriding treatment can be conducted to the surface and in depth of 1 to 10 nm from the surface. With this extremely thin silicon nitride layer, it is possible to form the blocking layer without giving an effect of stress to the semiconductor layer formed over the silicon nitride layer.

As the semiconductor layer 1002, a crystalline semiconductor film is preferably used. The crystalline semiconductor film can be obtained by crystallizing an amorphous semiconductor film. As a crystallizing method, a laser crystallization method, a thermal crystallization method using RTA or an annealing furnace, a thermal crystallization method using a metal element for promoting crystallization, or the like can be used. The semiconductor layer 1002 has a channel formation region and a pair of impurity regions to which an impurity element imparting one conductivity type is added. An impurity region with the impurity element added at low concentration may be provided between the channel formation region and the pair of impurity regions. The semiconductor layer 1002 can have a structure in which an impurity element imparting one conductivity type or an impurity element imparting a conductivity type which is opposite of the former conductivity is added entirely.

The first insulating layer 1003 can be formed with a single film or formed by stacking a plurality of films, using silicon oxide, silicon nitride, silicon nitride oxide, or the like. In this case, a surface of the insulating film may be oxidized or nitrided so as to be more dense, by a high-density plasma treatment excited by microwaves under a condition in which the electron temperature is 2 eV or less, the ion energy is 5 eV or less, and the electron density ranges from $10^{11}/cm^3$ to $10^{13}/cm^3$. This treatment may be conducted before the formation of the first insulating layer 1003. That is to say, the plasma treatment is conducted to a surface of the semiconductor layer 1002. At this time, the substrate temperature is set in the range of 300 to 450° C. under an oxygen atmosphere ($O_2$, $N_2O$, or the like) or a nitrogen atmosphere ($N_2$, $NH_3$, or the like), thereby forming a favorable interface with a gate insulating layer to be deposited thereover.

The gate electrode 1004 and the conductive layer 1104 may have a single-layer structure or a multilayer structure including one element or a plurality of elements selected from Ta, W, Ti, Mo, Al, Cu, Cr, and Nd, or an alloy or compound material including plural elements selected from the above elements.

The TFT 1100 includes the semiconductor layer 1002, the gate electrode 1004, and the first insulating layer 1003 between the semiconductor layer 1002 and the gate electrode 1004. In FIG. 9, a TFT connected to the first electrode 1008 of the light-emitting element 1012 is shown as the TFT 1100 for forming the pixel. This TFT 1100 has a multigate structure in which a plurality of gate electrodes 1004 are disposed over the semiconductor layer 1002. In other words, a plurality of TFTs are connected serially. This structure makes it possible to suppress the unnecessary increase in off current. Moreover, the TFT 1100 is a top gate TFT in FIG. 9; however, a bottom gate TFT having a gate electrode below the semiconductor layer can also be employed. Further, a dual gate TFT having gate electrodes over and below the semiconductor layer is also applicable.

The capacitor portion 1101 has the first insulating layer 1003 as a dielectric, and has the semiconductor layer 1002 and the conductive layer 1104, which oppose to each other with the first insulating layer 1003 interposed therebetween, as a pair of electrodes. As the capacitor element provided in the pixel, one of a pair of electrodes is a semiconductor layer 1102 formed at the same time as the semiconductor layer 1002 of the TFT 1100 while the other conductive layer 1104 is a layer formed at the same time as the gate electrode 1004 in FIG. 9. However, the present invention is not limited to this structure.

The second insulating layer 1005 is preferably an insulating layer having a barrier property for blocking ionic impurities, such as a silicon nitride film. This second insulating layer 1005 is formed with silicon nitride or silicon oxynitride. This second insulating layer 1005 also serves as a protective film for preventing pollution of the semiconductor layer 1002. After depositing the second insulating layer 1005, a high-density plasma treatment excited by microwaves may be conducted as mentioned above by introducing hydrogen gas, so that the second insulating layer 1005 is hydrogenated. Alternatively, ammonia gas may be introduced to nitride and hydrogenate the second insulating layer 1005. Further, oxygen, $N_2O$ gas, or the like may be introduced together with hydrogen gas to conduct an oxynitride treatment and a hydrogenation treatment. By conducting a nitride treatment, an oxide treatment, or an oxynitride treatment according to this method, a surface of the second insulating layer 1005 can be made dense. Accordingly, the function as the protective film can be strengthened. The hydrogen introduced in the second insulating layer 1005 can be released from silicon nitride forming the second insulating layer 1005 by conducting a heat treatment at 400 to 450° C. thereafter, so that the semiconductor layer 1002 can be hydrogenated.

The third insulating layer 1006 can be formed with an inorganic insulating film or an organic insulating film. As the inorganic insulating film, a silicon oxide film formed by a CVD method, a SOG (Spin On Glass) film (a silicon oxide film formed by applying liquid), or the like can be used. As the organic insulating film, a film formed with polyimide, polyamide, BCB (Benzocyclobutene), acrylic, a positive photosensitive organic resin, a negative photosensitive organic resin, or the like can be used. Moreover, a material whose skeletal structure includes a bond of silicon (Si) and oxygen (O) can be used as the third insulating layer 1006. As the substituent of this material, an organic group including at least hydrogen (such as an alkyl group or aromatic hydrocarbon) is used. Further, a fluoro group may be used as the substituent. Furthermore, a fluoro group and an organic group including at least hydrogen may be used as the substituent.

As the wire 1007, a single layer or multilayer structure including one element selected from Al, Ni, C, W, Mo, Ti, Pt, Cu, Ta, Au, and Mn or an alloy including plural elements selected from the above elements can be used.

One or both of the first electrode 1008 and the second electrode 1010 can be a transparent electrode/transparent electrodes. As the transparent electrode, indium oxide containing tungsten oxide, indium zinc oxide containing tungsten oxide, indium oxide containing titanium oxide, indium tin oxide containing titanium oxide, indium tin oxide containing molybdenum, or the like can be used. Needless to say, it is possible to use indium tin oxide, indium zinc oxide, indium tin oxide with silicon oxide added, or the like.

At least one of the first electrode 1008 and the second electrode 1010 may be formed with a material not having a light-transmitting property. For example, alkali metal such as Li or Cs; alkali-earth metal such as Mg, Ca, or Sr; an alloy including any one of these (such as Mg:Ag, Al:Li, or Mg:In); or a compound of these elements ($CaF_2$) can be used. In addition to these, rare-earth metal such as Yb or Er can be used.

As the fourth insulating layer 1011, a similar material to that of the third insulating layer 1006 can be used.

The light-emitting element 1012 has the EL layer 1009, and the first electrode 1008 and the second electrode 1010 for having the EL layer 1009 interposed therebetween. One of the first electrode 1008 and the second electrode 1010 corresponds to an anode while the other corresponds to a cathode. When voltage higher than threshold voltage is applied between the anode and the cathode with forward bias, current flows from the anode to the cathode, whereby the light-emitting element 1012 emits light.

The EL layer 1009 has a single-layer or multilayer structure. In the case of the multilayer structure, layers forming the EL layer 1009 can be categorized into a hole-injecting layer, a hole-transporting layer, a light-emitting layer, an electron-transporting layer, an electron injecting layer, and the like according to the carrier-transporting property. The boundary between these layers is not always necessary to be clear and, in some cases, the materials of the layers are partially mixed and the boundary is unclear. The layers can be formed with an organic material or an inorganic material. As the organic material, any one of a high-molecular material, a middle-molecular material, and a low-molecular material can be used.

The EL layer 1009 is preferably formed with a plurality of layers with different functions, such as a hole-injecting/transporting layer, a light-emitting layer, and an electron-injecting/transporting layer. The hole-injecting/transporting layer is preferably formed with a complex material including an organic compound material having a hole-transporting property and an inorganic compound material showing an electron-receiving property with respect to the organic compound material. By having such a structure, a number of hole carriers are generated in the organic compound originally having almost no intrinsic carriers and an extremely superior hole-injecting/transporting property can be obtained. This effect makes it possible to decrease the drive voltage as compared with before. Moreover, the hole-injecting/transporting layer can be made thick without causing the drive voltage to increase. Thus, a short-circuit of the light-emitting element due to dust or the like can be suppressed.

As the organic compound material having a hole-transporting property, for example, the following can be used: copper phthalocyanine (abbreviated to CuPc); 4,4',4"-tris[N-(3-methylphenyl)-N-phenylamino]triphenylamine (abbreviated to MTDATA); 1,3,5-tris[N,N-di(m-tolyl)amino]benzene (abbreviated to m-MTDAB), N,N'-diphenyl-N,N'-bis(3-methylphenyl)-1,1'-biphenyl-4,4'-diamine (abbreviated to TPD), 4,4'-bis[N-(1-naphtyl)-N-phenylamino]biphenyl (abbreviated to NPB), 4,4'-bis{N-[4-di(m-tolyl)amino]phenyl-N-phenylamino}biphenyl (abbreviated to DNTPD), and the like. However, the organic compound material having a hole-transporting property is not limited to these.

As the inorganic compound material having an electron-receiving property, titanium oxide, zirconium oxide, vanadium oxide, molybdenum oxide, tungsten oxide, rhenium oxide, ruthenium oxide, zinc oxide, or the like is given. In particular, vanadium oxide, molybdenum oxide, tungsten oxide, and rhenium oxide are preferable because they can be formed by vacuum evaporation and easily treated.

The electron-injecting/transporting layer is formed with an organic compound material having an electron-transporting property. Specifically, tris(8-quinolinolato)aluminum (abbreviated to $Alq_3$), tris(4-methyl-8-quinolinolato)aluminum (abbreviated to $Almq_3$), bis(2-methyl-8-quinolinolato)(4-phenylphenolato)aluminum (abbreviated to BAlq), bathocuproin (abbreviated to BCP), 2-(4-biphenylyl)-5-(4-tert-butylphenyl)-1,3,4-oxadiazole (abbreviated to PBD), 3-(4-biphenylyl)-4-phenyl-5-(4-tert-butylphenyl)-1,2,4-triazole (abbreviated to TAZ), and the like are given though the organic compound material having an electron-transporting property is not limited to these.

The light-emitting layer can be formed with the following material: 9,10-di(2-naphtyl)anthracene (abbreviated to DNA); 9,10-di(2-naphthyl)-2-tert-butylanthracene (abbreviated to t-BuDNA); 4,4'-bis(2,2-diphenylvinyl)biphenyl (abbreviated to DPVBi); coumarin 30; coumarin 6; coumarin 545; coumarin 545T; rubrene; 2,5,8,11-tetra(tert-butyl) perylene (abbreviated to TBP); 9,10-diphenylanthracene (abbreviated to DPA), 5,12-diphenyltetracene; 4-(dicyanomethylene)-2-methyl-[p-(dimethylamino)styryl]-4H-pyrane (abbreviated to DCM1); 4-(dicyanomethylene)-2-metyl-6-[2-(julolidine-9-yl)ethenyl]-4H-pyrane (abbreviated to DCM2); or the like. Moreover, the following compound emitting phosphorescence can be used: bis {2-[3',5'-bis(trifluoromethyl)phenyl]pyridinato-N,$C^{2'}$}iridium(picolinate) (abbreviated to Ir($CF_3$ ppy)$_2$(pic)); tris(2-phenylpyridinato-N,$C^{2'}$)iridium (abbreviated to Ir(ppy)$_3$); bis(2-phenylpyridinato-N,$C^{2'}$)iridium(acetylacetonate) (abbreviated to Ir(ppy)$_2$(acac)); bis[2-(2'-thienyl)pyridinato-N,$C^{3'}$]iridium(acetylacetonate) (abbreviated to Ir(thp)$_2$(acac)); bis(2-phenylquinolinato-N,$C^{2'}$)iridium(acetylacetonate) (abbreviated to Ir(pq)$_2$(acac)); and the like.

The light-emitting layer may use a singlet excited light-emitting material and a triplet excited material including a metal complex or the like. For example, among a red light-emitting pixel, a green light-emitting pixel, and a blue light-emitting pixel, the red light-emitting pixel whose luminance half-reduced period is relatively short is formed with a triplet-excited light-emitting material and the others are formed with singlet-excited light-emitting materials. Because of high luminous efficiency, the power consumption of a triplet-excited light-emitting material is less than that of a singlet-excited light-emitting material when the same luminance is to be obtained. In other words, since if the red light-emitting pixel is formed with a triplet-excited light-emitting material, the reliability thereof can be improved because the amount of current to be fed to the light-emitting element is small. In order to decrease the power consumption, the red light-emitting pixel and the green light-emitting pixel may be formed with a triplet-excited light-emitting material and the blue light-emitting pixel may be formed with a singlet-excited light-emitting material. By forming the green light-emitting element, which has high visibility to human eyes, with a triplet-excited light-emitting material in this way, further reduction in the power consumption can be achieved.

Moreover, an inorganic material may be used for the light-emitting layer. As a base material used in the light-emitting material, sulfide, oxide, or nitride can be used. As the sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. Moreover, as the oxide, for example, zinc oxide (ZnO), yttrium oxide ($Y_2O_3$), or the like can be used. As the nitride, for example, aluminum nitride (AlN), gallium nitride (GaN), indium nitride (InN), or the like can be used. Further, zinc selenide (ZnSe), zinc telluride (ZnTe), or the like can be used. A ternary mixed crystal such as calcium sulfide-gallium ($CaGa_2S_4$), strontium sulfide-gallium ($SrGa_2S_4$), or barium sulfide-gallium ($BaGa_2S_4$) may be used.

As a light emission center using core electron transition of a metal ion, manganese (Mn), copper (Cu), samarium (Sm), terbium (Tb), erbium (Er), thulium (Tm), europium (Eu), cerium (Ce), praseodymium (Pr), or the like can be used. As charge compensation, a halogen element such as fluorine (F) or chlorine (Cl) may be added.

As a light emission center using donor-acceptor recombination, a light-emitting material including a first impurity element and a second impurity element can be used. As the first impurity element, for example, copper (Cu), silver (Ag), gold (Au), platinum (Pt), silicon (Si), or the like can be used. As the second impurity element, for example, fluorine (F), chlorine (Cl), bromine (Br), iodine (I), boron (B), aluminum (Al), gallium (Ga), indium (In), thallium (Tl), or the like can be used.

The light-emitting material can be obtained by solid phase reaction, i.e., by a method in which a base material and an impurity element are weighed and mixed in a mortar and the mixture is heated in an electric furnace, so that the impurity element is contained in the base material. For example, after the base material, the first impurity element or a compound including the first impurity element, and the second impurity element or a compound including the second impurity element are weighed respectively and mixed in a mortar, the mixture is heated and baked in an electric furnace. The baking is preferably performed at 700 to 1500° C. If the temperature is too low, solid reaction will not progress, and if the temperature is too high, the base material will be decomposed. The baking may be conducted in a powder state; however, the baking is preferably conducted in a pellet state.

As the impurity element in the case of applying solid phase reaction, a compound including the first impurity element and the second impurity element may be combined. In this case, since the impurity elements are easily diffused to promote the solid phase reaction, a uniform light-emitting material can be obtained. Moreover, since the impurity element is not included excessively, a light-emitting material with high purity can be obtained. As the compound including the first impurity element and the second impurity element, for example, copper fluoride ($CuF_2$), copper chloride (CuCl), copper iodide (CuI), copper bromide (CuBr), copper nitride ($Cu_3N$), copper phosphide ($Cu_3P$), silver fluoride (AgF), silver chloride (AgCl), silver iodide (AgI), silver bromide (CuBr), gold chloride ($AuCl_3$), gold bromide ($AuBr_3$), platinum chloride ($PtCl_2$), or the like can be used.

A light-emitting material containing a third impurity element instead of the second impurity element may be used. As the third impurity element, for example, lithium (U), sodium (Na), kalium (K), rubidium (Rb), cesium (Cs), nitrogen (N), phosphorus (P), arsenic (As), antimony (Sb), bismuth (Bi), or the like can be used. The concentration of such an impurity element may range from 0.01 to 10 mol % with respect to the base material, and preferably ranges from 0.1 to 5 mol %.

As the light-emitting material having high electric conductance, it is possible to use a light-emitting material including a light-emitting material which contains the above-mentioned first impurity element, second impurity element, and third impurity element by using the above material as the base material. The concentration of the impurity element may range from 0.01 to 10 mol % with respect to the base material, and preferably ranges from 0.1 to 5 mol %.

As the compound including the second impurity element and the third impurity element, for example, alkali halide such as lithium fluoride (LiF), lithium chloride (LiCl), lithium iodide (LiI), copper bromide (LiBr), or sodium chloride (NaCl); boron nitride (BN); aluminum nitride (AlN); aluminum antimonide (AlSb); gallium phosphide (GaP); gallium arsenide (GaAs); indium phosphide (InP); indium arsenide (InAs), indium antimonide (InSb), or the like can be used.

A light-emitting layer which uses the above-mentioned material as a base material and which uses a light-emitting material including the above-mentioned first impurity element, second impurity element, and third impurity element can emit light without needing hot electrons accelerated by a high electric field. That is to say, since it is no longer necessary to apply high voltage to the light-emitting element, the light-emitting element can operate at low drive voltage. Moreover, since light emission is possible at low drive voltage, the power consumption of the light-emitting element can be decreased. Further, another element to be a light emission center may be included.

A light-emitting material which uses the above-mentioned material as a base material and which uses a light-emitting material including a light emission center using core electron transition of an ion of the above-mentioned metal and the second and third impurity elements can be used. In this case, the metal ion to be a light emission center is preferably 0.05 to 5 atom % with respect to the base material. Moreover, the concentration of the second impurity element is preferably 0.05 to 5 atom % with respect to the base material. Further, the concentration of the third impurity element is preferably 0.05 to 5 atom % with respect to the base material. The light-emitting material having such a structure can emit light at low voltage. Therefore, since a light-emitting element which can emit light at low drive voltage can be obtained, the power consumption of the light-emitting element can be decreased. Further, another element to be a light emission center may be included.

In any way, the layer structure of the light-emitting layer can be modified. Within the scope for achieving the object as the light-emitting element, such modification is allowable that specific hole or electron injecting/transporting layer and light-emitting layer are replaced by electrode layers having the same purposes or a light-emitting material is provided by being diffused.

The light-emitting layer may have a structure for displaying with colors by forming a light-emitting layer with a different light emission wavelength band for each pixel. Typically, light-emitting layers each corresponding to each color of R (red), G (green), and B (blue) are formed. Even in this case, when, on a light emission side of the pixel, a filter for passing light with the light emission wavelength band is provided, color purity can be increased and reflection of the pixel portion can be prevented. By providing the filter, it is possible to omit a circular polarizing plate and the like which have been conventionally required and to avoid the loss of light emitted from the light-emitting layer. Moreover, the change of color tone when the pixel portion (display screen) is viewed obliquely can be decreased.

In a display device having the pixel shown in FIG. 9, the reduction in the power consumption can be achieved by including the data latch circuit shown in Embodiment Mode 1 or 2. In other words, since the data latch circuit can have a structure in which the power consumption can be decreased by decreasing through current, which is not affected by the variation in TFT characteristics, and which can operate certainly, it is no longer necessary to boost an external circuit and it is possible to decrease the power consumption, the layout area, and the cost.

Embodiment Mode 7

Figure 10:
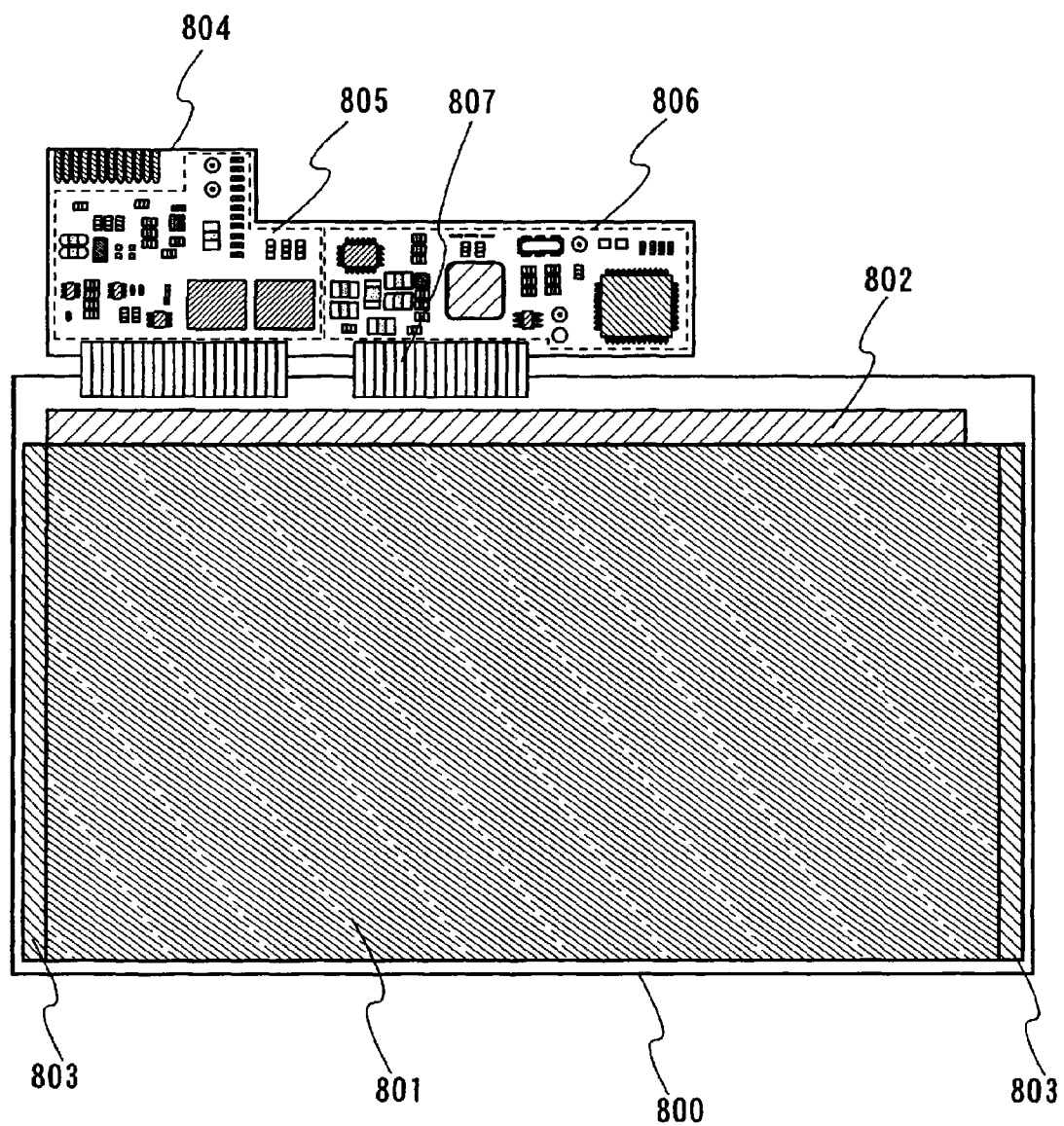
FIG. 10 shows a display module of Embodiment Mode 7.

FIG. 10 shows a display module in which a display panel 800 and a control circuit 804 are combined. The display panel 800 has a pixel portion 801, a signal line driver circuit 802, and a scan line driver circuit 803, which are similar to those in the structure shown in FIG. 6B. Various electronic appliances can be manufactured by incorporating such a display module.

Embodiment Mode 8

This embodiment mode will describe a mobile phone as an example of electronic appliances of the present invention.

Figure 11:
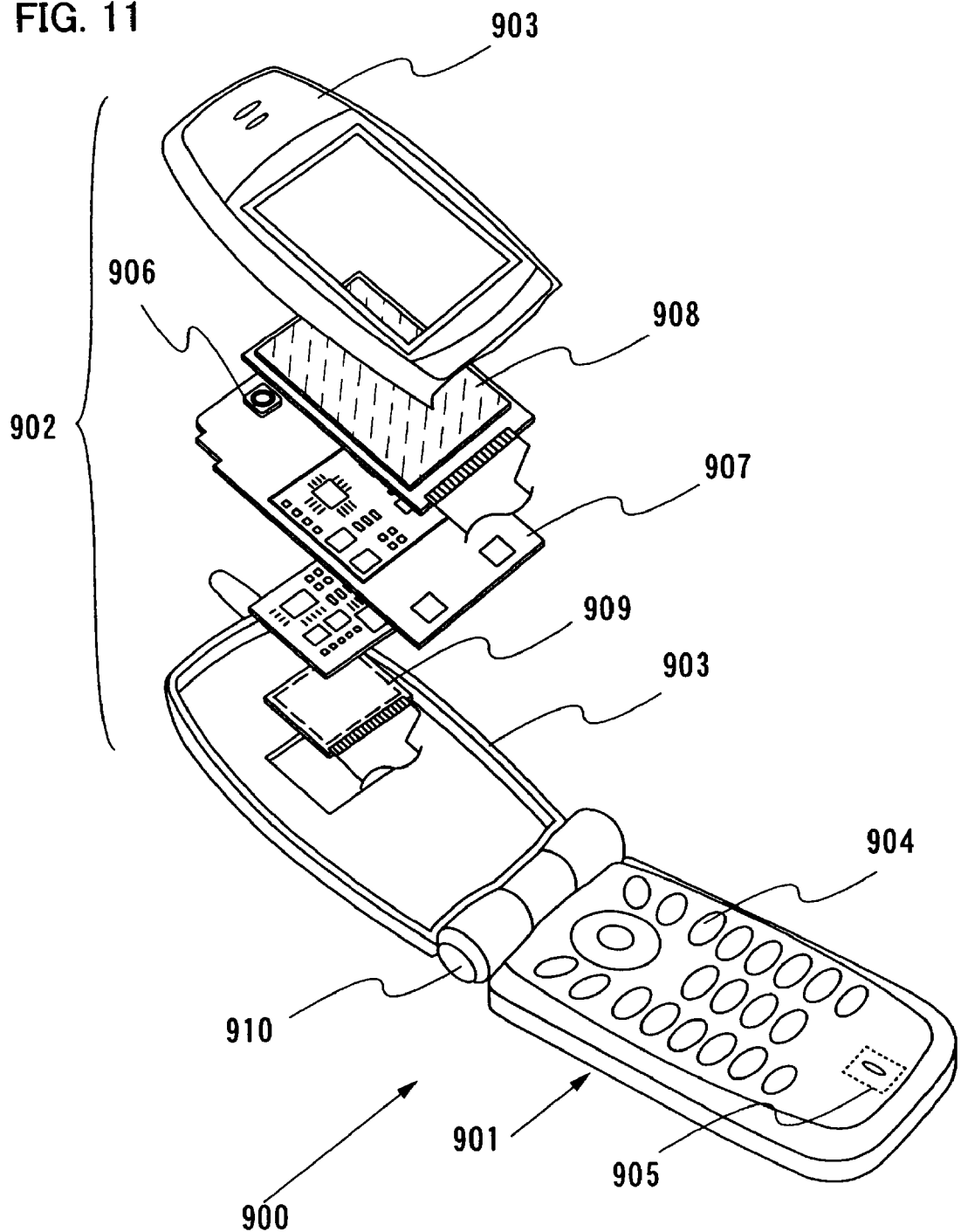
FIG. 11 shows a structure of a mobile phone of Embodiment Mode 8.

A mobile phone 900 shown in FIG. 11 has a main body (A) 901 and a main body (B) 902 which are connected to each other with a hinge 910 so as to open and close. The main body (A) 901 is equipped with operation switches 904, a microphone 905, and the like while the main body (B) 902 is equipped with a display panel (A) 908, a display panel (B) 909, a speaker 906, and the like. The display panel (A) 908 and the display panel (B) 909 are housed in a case 903 of the main body (B) 902 together with a circuit substrate 907. Pixel portions of the display panel (A) 908 and the display panel (B) 909 are arranged so as to be observed through opening windows formed at the case 903.

The specifications of the display panel (A) 908 and the display panel (B) 909, such as the number of pixels can be appropriately determined in accordance with the function of the mobile phone 900. For example, the display panel (A) 908 can serve as a main screen and the display panel (B) 909 can serve as a subscreen.

Then, the display panel (A) 908 can be a color-display screen of high definition for displaying letters and images, and the display panel (B) 909 can be an information-display screen of a single color for displaying text information. In particular, when the display panel (B) 909 is of an active matrix type and has high definition, various text information can be displayed to increase the density of information display per screen. For example, the display panel (A) 908 is a QVGA (320 dots×240 dots) panel of 2 to 2.5 inches with 64 grayscales and 260,000 colors while the display panel (B) 909 is a high-definition panel of 180 to 220 ppi with a single color and 2 to 8 grayscales. Thus, alphabets, hiraganas, and katakanas as well as kanjis, Arabic letters, face marks, and the like can be displayed.

The display panel (A) 908 and the display panel (B) 909 are equipped with a structure which is similar to that shown in Embodiment Modes 3 to 7. In other words, by including the data latch circuit shown in Embodiment Mode 1 or 2, it is possible to reduce the power consumption, avoid an effect of the variation in TFT characteristics, and operate certainly. This contributes to the decrease in the power consumption of the mobile phone 900, allowing long-time use of the mobile phone. Moreover, since a battery of the mobile phone can be made small, the mobile phone can be more lightweight.

Such a mobile phone 900 can display images by various driving methods. For example, a time grayscale method is given. According to the time grayscale method, grayscale is displayed by changing a lighting period of a light-emitting element which emits light with constant luminance. For example, if light is on during one frame period, the lighting ratio is 100%. If light is on for a half of one frame period, the lighting ratio is 50%. When the frame frequency is high to some extent, generally, when the frame frequency is 60 Hz or more, blinking cannot be recognized with human eyes and is recognized as halftone. By changing the lighting ratio in this way, the grayscale can be expressed.

Figure 13A:
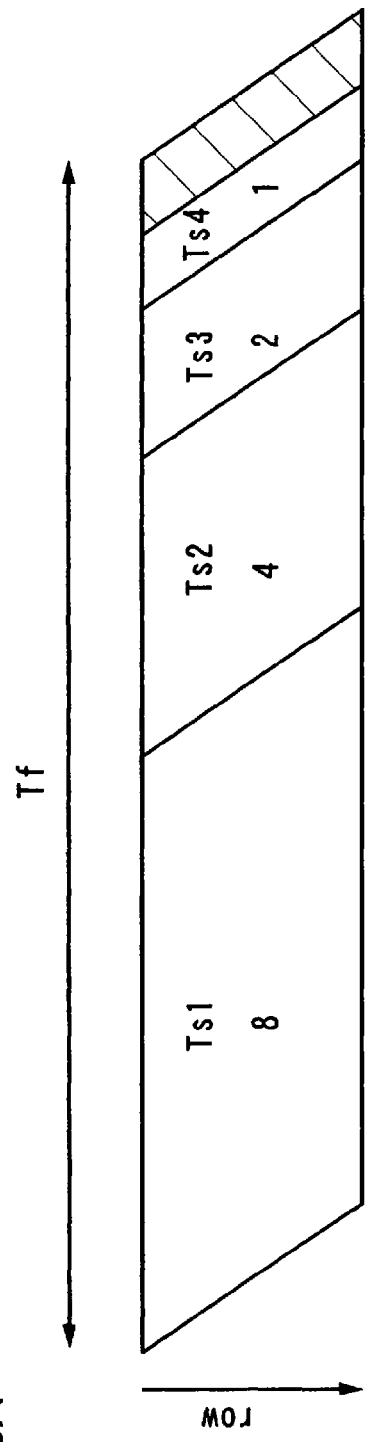
FIGS. 13A and 13B show a method for driving a mobile phone of Embodiment Mode 8.

In FIG. 13A, the horizontal axis shows time passage while the perpendicular axis shows a row number of a display screen. In this example, writing is conducted in order from the top; therefore, display may be late. Although writing is conducted in order from the top in the example of FIG. 13A, the present invention is not limited to this. An example of 4 bits is hereinafter described.

In FIG. 13A, one frame is divided into four subframes (Ts1, Ts2, Ts3, and Ts4). The length ratio of these subframe periods is Ts1:Ts2:Ts3:Ts4=8:4:2:1. By combining these subframes, the length of the lighting period can be set to any one of 0 to 15. In this way, one frame can be divided into power-of-two number of subframes to express the grayscale. Moreover, since the lighting period is short in Ts4, an upper half of the screen needs to be turned off before the termination of the writing in a lower half of the screen; therefore, the writing and erasing are conducted in parallel.

Figure 13B:
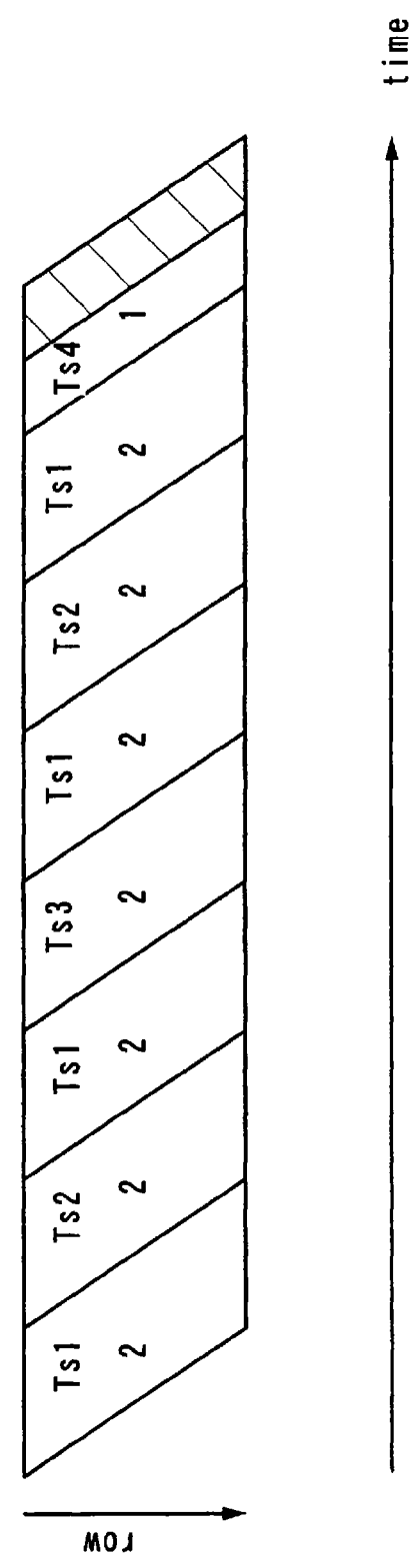

FIG. 13B shows an example in which grayscale is expressed by different time division from that in FIG. 13A. In the case of the grayscale expression means in FIG. 13A, when a high-order bit changes, a defect called false contour occurs. This is optical illusion that an image looks differently from original grayscale when seventh grayscale and eighth grayscale are viewed alternately with human eyes. Therefore, in FIG. 13B, the high-order bit is divided to decrease the false contour phenomenon described above. Specifically, the most significant bit (here Ts1) is divided into four and disposed within one frame. Moreover, the second bit (here Ts2) is divided into two and disposed within one frame. In this way, a bit which is long in terms of time is divided to decrease the false contour.

Figures 14A, 14B, 14C:
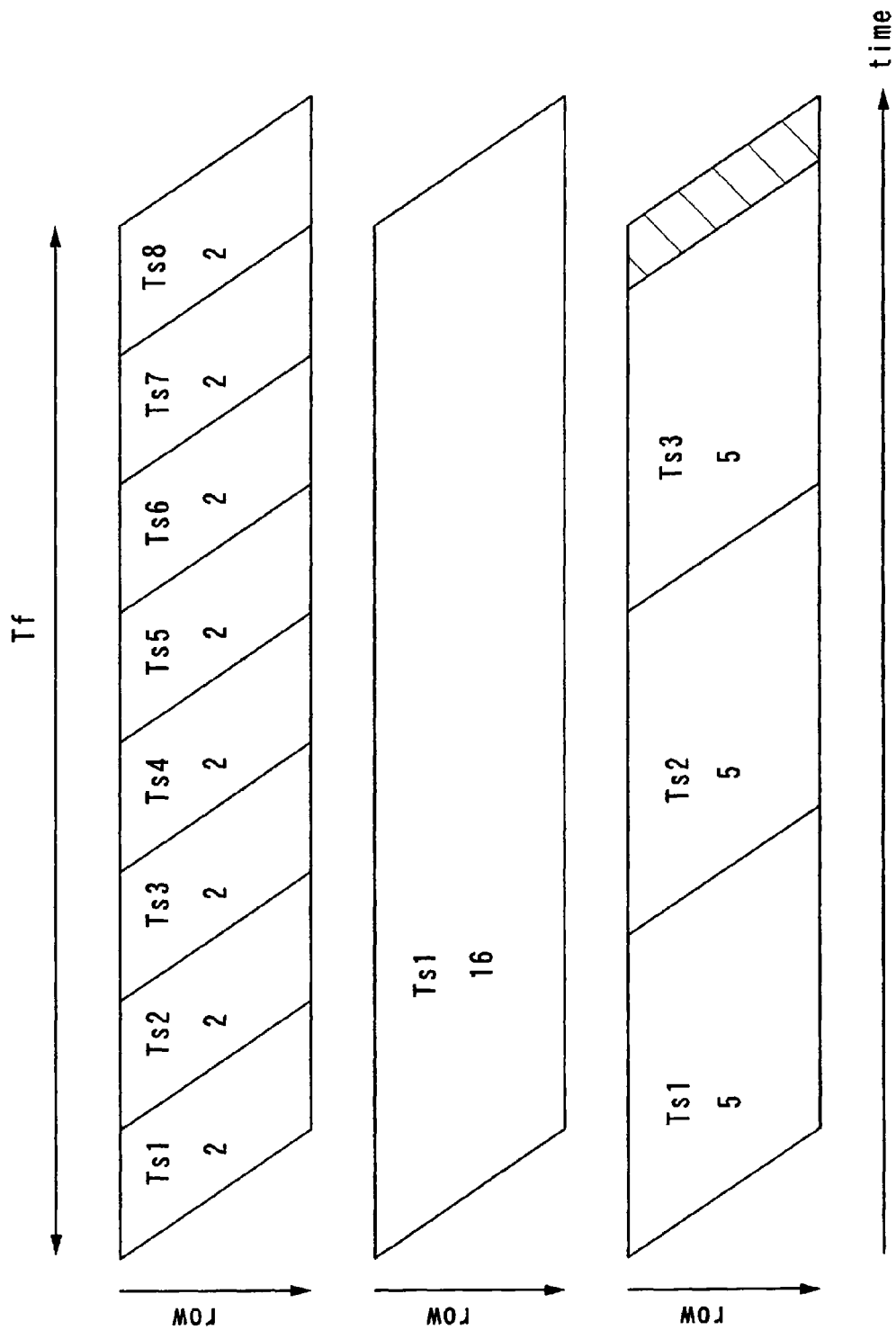
FIGS. 14A to 14C show a method for driving a mobile phone of Embodiment Mode 8.

In FIG. 14A, the subframe is divided at an even interval, not into power-of-two number so as to prevent the false contour. In this method, since there is no large division of bits, the false contour does not occur but the grayscale itself gets rough. Therefore, FRC (frame rate control), a dither, or the like is used to complement the grayscale.

FIG. 14B shows a case of displaying with two grayscales. In this case, since one frame includes only one subframe, the number of rewriting times is one per frame, which makes it possible to decrease the power consumption of a controller and a driver. In the mobile phone, if text information of email or the like is displayed mainly (mail mode), the number of grayscales may be lower than in the case of displaying motion pictures or still images; therefore, display placing a priority on the power consumption is possible. By combining such display and the aforementioned FIGS. 13A, 13B, 14A, and the like, it is possible to separately employ the case in which a large number of grayscales is necessary and the case in which a small number of grayscales is enough, thereby decreasing the power consumption.

FIG. 14C shows an example of expressing 4 grayscales, in which display is carried out by writing three times in one frame period. This can apply to, for example, the case of a still image such as a comic in which the number of grayscales is better to be increased as compared with the case of displaying text information. The number of grayscales may be set in the range of about 4 to 16 grayscales.

In this way, the power consumption of the mobile phone can be decreased by combining the display panel including the data latch circuit shown in Embodiment Mode 1 or 2 and a drive method including a motion picture or natural image mode with 16 grayscales or more, a still image mode for displaying with 4 to 16 grayscales, and a mail mode for displaying with 2 to 8 grayscales.

The mobile phone shown in this embodiment mode can be modified variously in accordance with its function and intended purpose. For example, by incorporating an image pickup device into a part of the hinge 910, the mobile phone can also serve as a camera. Moreover, the aforementioned advantageous effect can be obtained even by a structure in which the operation switches 904, the display panel (A) 908, and the display panel (B) 909 are housed in one case. Further, a similar advantageous effect can also be obtained by applying the structure of this embodiment mode to an information display terminal equipped with a plurality of display portions. The structure of this embodiment can be applied to not only the mobile phone but also information terminals typified by a computer equipped with a display panel and an input means such as an operation switch and a PDA (personal digital assistant).

Embodiment Mode 9

This embodiment mode will show an example of a television device as an electronic appliance of the present invention.

Figure 12:
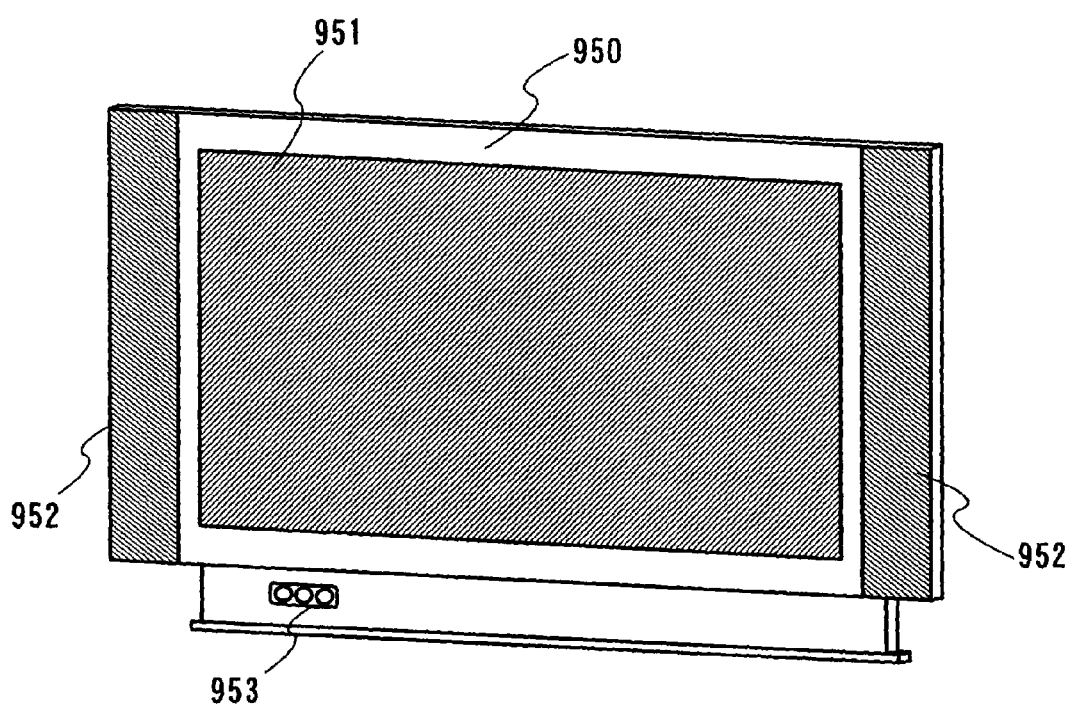
FIG. 12 shows a structure of a television device of Embodiment Mode 9.

FIG. 12 shows a television device of the present invention, which includes a main body 950, a display portion 951, a speaker portion 952, operation switches 953, and the like. In this television device, the display portion 951 is equipped with a similar structure to that shown in Embodiment Modes 3 to 7. In other words, by including the data latch circuit shown in Embodiment Mode 1 or 2, the power consumption can be decreased, an effect due to the variation in TFT characteristics can be avoided, and the operation can be conducted certainly. This contributes to the decrease in the power consumption of the television device.

By having such a structure, since the number of power source circuits can be decreased or the size thereof can be reduced to a large degree in the television device, the main body 950 can be reduced in weight and size and be thinned. A television device in which the decrease in the power consumption, the improvement of image quality, and the reduction in weight have been achieved can provide a product suitable for dwelling environment.

(Additional Statement)

As described above, the present invention can provide the following modes.

A data latch circuit including an analog switch for taking in a data signal depending on high level and low level states of a sampling signal and an inverted sampling signal; a first n-channel transistor which is turned on or off depending on the high level and low level states of the data signal; a second n-channel transistor which is connected in series to the first n-channel transistor and which is turned on or off depending on the high level and low level states of the inverted sampling signal; a p-channel transistor which is turned on or off depending on the high level and low level states of the inverted sampling signal; and a memory circuit, to which a low power source potential is inputted through the first n-channel transistor and the second n-channel transistor and a high power source potential is inputted through the p-channel transistor.

In this case, the memory circuit may be a dynamic memory or a static memory.

In this case, the memory circuit may comprise an inverter and a clocked inverter.

In this case, the memory circuit may comprise two inverters and an analog switch.

Further, in this case, an amplitude of the data signal may be smaller than a potential difference between the high power source and the low power source.

A data latch circuit including a first n-channel transistor; a second n-channel transistor; a p-channel transistor; an inverter; a clocked inverter; and an analog switch, wherein a gate electrode of the second n-channel transistor is connected to a gate electrode of the p-channel transistor, wherein a first electrode of the p-channel transistor and a first electrode of the second n-channel transistor are respectively connected to a first power source and a second power source, wherein a second electrode of the second n-channel transistor is connected to a first electrode of the first n-channel transistor, wherein a second electrode of the first n-channel transistor, a second electrode of the p-channel transistor, an input terminal of the inverter, and an output terminal of the clocked inverter are connected to each other, wherein an output terminal of the inverter and an input terminal of the clocked inverter are connected to each other, wherein one of input/output terminals of the analog switch is connected to a gate electrode of the first n-channel transistor, and wherein an input signal from outside is inputted to the other of the input/output terminals of the analog switch.

In this case, when the analog switch is turned on, the p-channel transistor is turned on, the second n-channel transistor is turned off, the clocked inverter is high impedance, and a potential of the first power source is supplied to the input terminal of the inverter.

In this case, when the analog switch is turned off, the p-channel transistor is turned off, the second n-channel transistor is turned on, a power source potential to be supplied to the input terminal of the inverter is determined to be a potential of the first power source or a potential of the second power source depending on a level of the input signal to be inputted to the gate electrode of the first n-channel transistor, and just after that, the clocked inverter serves as an inverter.

Further, in this case, an amplitude of the input signal may be smaller than a potential difference between the first power source and the second power source.

A data latch circuit including a first n-channel transistor; a second n-channel transistor; a p-channel transistor; a first inverter; a second inverter; a first analog switch; and a second analog switch, wherein a gate electrode of the second n-channel transistor is connected to a gate electrode of the p-channel transistor, wherein a first electrode of the p-channel transistor and a first electrode of the second n-channel transistor are respectively connected to a first power source and a second power source, wherein a second electrode of the second n-channel transistor and a first electrode of the first n-channel transistor are connected to each other, wherein one of input/output terminals of the second analog switch is connected to an output terminal of the second inverter, wherein a second electrode of the first n-channel transistor, a second electrode of the p-channel transistor, an input terminal of the first inverter, and the other of the input/output terminals of the second analog switch are connected to each other, wherein an output terminal of the first inverter and an input terminal of the second inverter are connected to each other, wherein a gate electrode of the first n-channel transistor is connected to one of input/output terminals of the first analog switch, and wherein an input signal is inputted to the other of the input/output terminals of the first analog switch.

In this case, when the first analog switch is turned on, the p-channel transistor is turned on, the second n-channel transistor is turned off, the second analog switch is high impedance, and a potential of the first power source is supplied to the input terminal of the first inverter.

In this case, when the first analog switch is turned off, the p-channel transistor is turned off, the second n-channel transistor is turned on, a power source potential to be supplied to the input terminal of the first inverter is determined to be a potential of the first power source or a potential of the second power source depending on a level of the input signal to be inputted to the gate electrode of the first n-channel transistor, and just after that, the second analog switch is turned on.

Further, in this case, an amplitude of the input signal may be smaller than a potential difference between the first power source and the second power source.

A data latch circuit including a first n-channel transistor and a second n-channel transistor connected in series to each other; a first p-channel transistor and a second p-channel transistor; a first analog switch, a second analog switch, and a third analog switch; and an inverter, wherein a gate electrode of the second n-channel transistor and a gate electrode of the first p-channel transistor are connected to each other; wherein a first electrode of the first p-channel transistor and a first electrode of the second p-channel transistor are connected to a first power source, a first electrode of the second n-channel transistor is connected to a second power source, wherein a second electrode of the second n-channel transistor is connected to a first electrode of the first n-channel transistor, wherein a second electrode of the first n-channel transistor, a second electrode of the first p-channel transistor, an input terminal of the inverter, and a second electrode of the second p-channel transistor are connected to each other, wherein ones of input/output terminals of the second analog switch and the third analog switch are connected to an output terminal of the inverter, wherein the others of the input/output terminals of the second analog switch and the third analog switch are connected to gate electrodes of the second p-channel transistor and the first n-channel transistor, wherein the gate electrode of the first n-channel transistor is connected to one of input/output terminals of the first analog switch, and wherein an input signal is inputted to the other of the input/output terminals of the first analog switch.

In this case, wherein when the first analog switch is turned on, the first p-channel transistor is turned on, the second n-channel transistor is turned off, the second analog switch and the third analog switch are high impedance, and a potential of the first power source is supplied to the input terminal of the inverter.

In this case, wherein when the first analog switch is turned off, the first p-channel transistor is turned off, the second n-channel transistor is turned on, a power source potential to be supplied to the input terminal of the inverter is determined to be a potential of the first power source or a potential of the second power source depending on a level of the input signal to be inputted to the gate electrode of the first n-channel transistor, and just after that, the second analog switch and the third analog switch is turned on.

Further, in this case, an amplitude of the input signal may be smaller than a potential difference between the first power source and the second power source.

In accordance with one feature of the present invention, a method of driving a data latch circuit comprises steps of:

initializing a potential of an input terminal of a memory circuit in a first period;

sampling an input signal for the memory circuit in said first period;

changing or holding the potential of the input terminal of the memory circuit depending on the sampled input signal in a second period after the first period; and holding the potential of the input terminal of the memory circuit or the changed potential of the input terminal of the memory circuit depending on the sampled input signal in a third period after the second period.

In this case, the memory circuit may be a dynamic memory or a static memory.

In this case, the memory circuit may comprise an inverter and a clocked inverter.

In this case, the memory circuit may comprise two inverters and an analog switch.

Further, in this case, an amplitude of the input signal may be smaller than a drive voltage of the memory circuit.

This application is based on Japanese Patent Application serial no. 2005-133654 filed in Japan Patent Office on 4, 28, in 2005, the entire contents of which are hereby incorporated by reference.

What is claimed is:

1. A data latch circuit comprising:
a first n-channel transistor;
a second n-channel transistor connected in series to the first n-channel transistor;
a first p-channel transistor;
a second p-channel transistor;
a first analog switch;
a second analog switch;
a third analog switch; and
an inverter,
wherein a gate electrode of the second n-channel transistor and a gate electrode of the first p-channel transistor are connected to each other;
wherein a first electrode of the first p-channel transistor and a first electrode of the second p-channel transistor are connected to a first power source,
wherein a first electrode of the second n-channel transistor is connected to a second power source,
wherein a second electrode of the second n-channel transistor is connected to a first electrode of the first n-channel transistor,
wherein a second electrode of the first n-channel transistor, a second electrode of the first p-channel transistor, an input terminal of the inverter, and a second electrode of the second p-channel transistor are connected to each other,
wherein one of an input terminal or an output terminal of the second analog switch and one of an input terminal or an output terminal of the third analog switch are connected to an output terminal of the inverter,
wherein the other of the input terminal or the output terminal of the second analog switch and the other of the input terminal or the output terminal of the third analog switch are respectively connected to the gate electrodes of the second p-channel transistor and the gate electrode of the first n-channel transistor,
wherein the gate electrode of the first n-channel transistor is connected to one of an input terminal or an output terminal of the first analog switch, and
wherein an input signal is inputted to the other of the input terminal or the output terminal of the first analog switch.

2. The data latch circuit according to claim 1,
wherein when the first analog switch is turned on, the first p-channel transistor is turned on, the second n-channel transistor is turned off, the second analog switch and the third analog switch are high impedance, and a potential of the first power source is supplied to the input terminal of the inverter.

3. The data latch circuit according to claim 1,
wherein when the first analog switch is turned off, the first p-channel transistor is turned off, the second n-channel transistor is turned on, a potential to be supplied to the input terminal of the inverter is determined to be a potential of the first power source or a potential of the second power source depending on a level of the input signal to be inputted to the gate electrode of the first n-channel transistor, and just after that, the second analog switch and the third analog switch are turned on.

4. The data latch circuit according to claim 1,
wherein a second potential to be supplied to the input terminal of the inverter is held by the first n-channel transistor, the second n-channel transistor, the inverter, and the third analog switch, and
wherein a first potential to be supplied to the input terminal of the inverter is held by the second p-channel transistor, the inverter, and the second analog switch.

5. The data latch circuit according to claim 1,
wherein an amplitude of the input signal is smaller than a potential difference between the first power source and the second power source.

6. A display device having the data latch circuit according to claim 1.

7. A mobile phone including a display module having the data latch circuit according to claim 1.

8. A television device including a display module having the data latch circuit according to claim 1.

* * * * *